US009838104B1

(12) United States Patent
Zhang et al.

(10) Patent No.: US 9,838,104 B1
(45) Date of Patent: Dec. 5, 2017

(54) SYSTEM AND METHOD FOR FAST COMPRESSION OF OFDM CHANNEL STATE INFORMATION (CSI) BASED ON CONSTANT FREQUENCY SINUSOIDAL APPROXIMATION

(71) Applicant: The Florida State University Research Foundation, Inc., Tallahassee, FL (US)

(72) Inventors: Zhenghao Zhang, Tallahassee, FL (US); Avishek Mukherjee, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 15/434,704

(22) Filed: Feb. 16, 2017

Related U.S. Application Data

(60) Provisional application No. 62/295,871, filed on Feb. 16, 2016.

(51) Int. Cl.
| | | |
|---|---|---|
| *H04B 17/00* | (2015.01) | |
| *H04B 15/00* | (2006.01) | |
| *H04B 7/06* | (2006.01) | |
| *H04B 7/08* | (2006.01) | |
| *H04L 1/00* | (2006.01) | |

(Continued)

(52) U.S. Cl.
CPC ......... *H04B 7/0626* (2013.01); *H04B 7/0854* (2013.01); *H04L 1/0006* (2013.01); *H04L 27/2601* (2013.01); *H04W 84/12* (2013.01)

(58) Field of Classification Search
CPC .... H04B 7/061; H04B 7/0619; H04B 7/0623; H04B 7/066; H04B 7/0663; H04L 1/0026; H04L 1/0047; H04L 1/0687; H04L 5/0007; H04L 5/0057; H04L 5/023; H04L 25/021; H04W 72/04
USPC ................. 455/63.1, 67.13, 501, 561, 562.1; 375/240, 262, 265, 316, 325, 340, 341; 370/252, 329
See application file for complete search history.

(56) References Cited

U.S. PATENT DOCUMENTS

| | | | | |
|---|---|---|---|---|
| 7,292,650 | B2 * | 11/2007 | Lee | .......................... H04L 5/006 375/316 |
| 8,638,845 | B2 * | 1/2014 | Hatakawa | ............. H04L 1/0029 375/240 |
| 8,908,587 | B2 | 12/2014 | Wang | |

(Continued)

OTHER PUBLICATIONS

Ferguson et al., Compression of channel state information for wireless ofdm transceivers. IEEE 72nd Vehicular Technology Conference Fall (VTC 2010-Fall). 2010: 1-5.

(Continued)

*Primary Examiner* — Quochien B Vuong
(74) *Attorney, Agent, or Firm* — Molly L. Sauter; Smith & Hopen, P.A.

(57) ABSTRACT

A system and method for the efficient compression of the Channel State Information (CSI) in a wireless network with very low complexity and implementation cost. In accordance with the present invention, the CSI can be approximated as the summation of very few sinusoids on constant frequencies and the parameters of the sinusoids can be found efficiently by very simple calculations such as dot products of vectors which are implementable in hardware at very low cost.

18 Claims, 20 Drawing Sheets

(51) Int. Cl.
*H04L 27/26* (2006.01)
*H04W 84/12* (2009.01)

(56) References Cited

U.S. PATENT DOCUMENTS

| | | | |
|---|---|---|---|
| 9,119,203 B2* | 8/2015 | Ahn | H04B 7/0639 |
| 9,258,089 B2* | 2/2016 | Yu | H04L 5/0032 |
| 2013/0201912 A1* | 8/2013 | Sheng | H04B 7/0413 |
| | | | 370/328 |

OTHER PUBLICATIONS

Huang et al., Limited feedback beamforming over temporally-correlated channels. IEEE Transactions on Signal Processing. 2009. vol. 57 (No. 5): 1959-1975.

Jiménez et al., Methods for compression of feedback in adaptive multi-carrier 4G schemes. Wireless Personal Communications. 2008. vol. 47:101-112.

Pohl et al., How often channel estimation is needed in MIMO systems. IEEE Global Telecommunications Conference (GLOBECOM 2003). 2003. vol. 2: 814-818.

Tadikonda, Adaptive bit allocation with reduced feedback for wireless multicarrier transceivers. PhD thesis, University of Kansas. 2007: 1-110.

\* cited by examiner

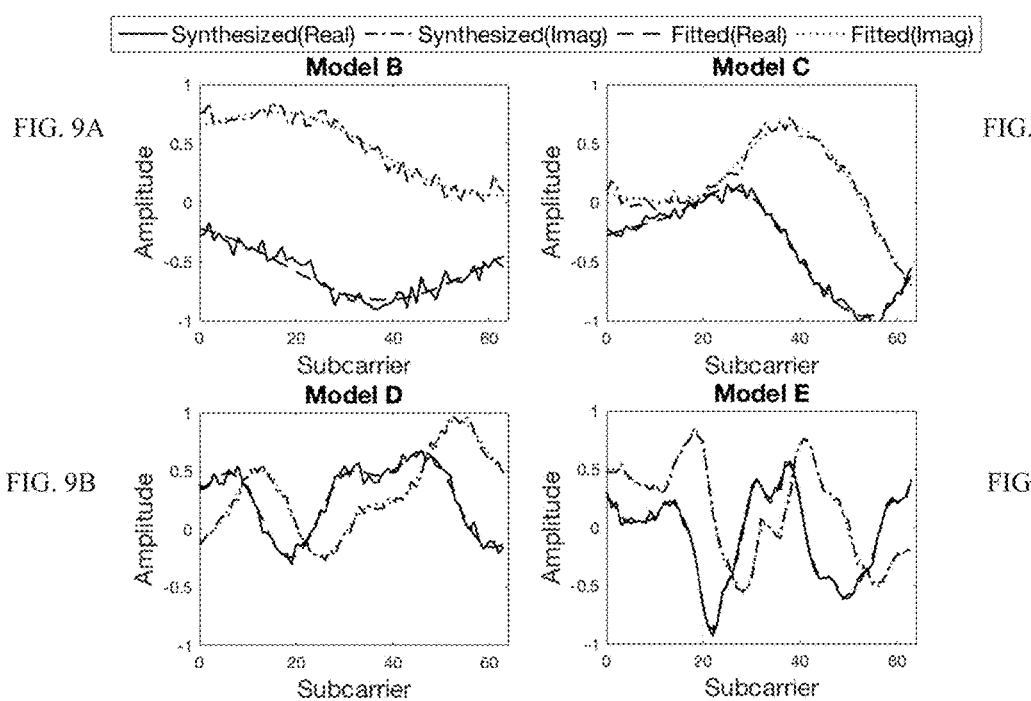

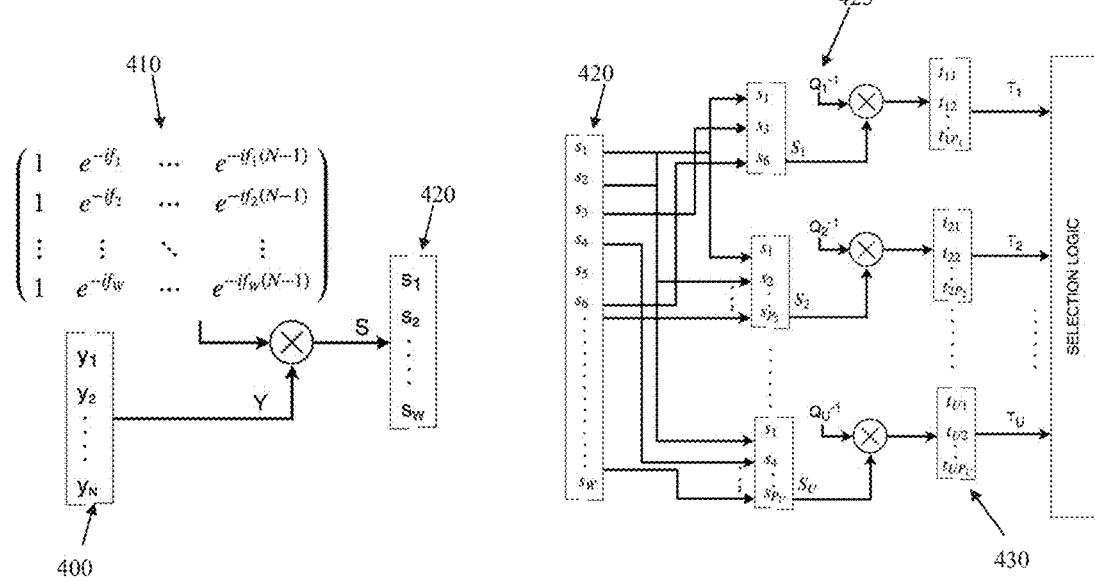
FIG. 19A
FIG. 19B
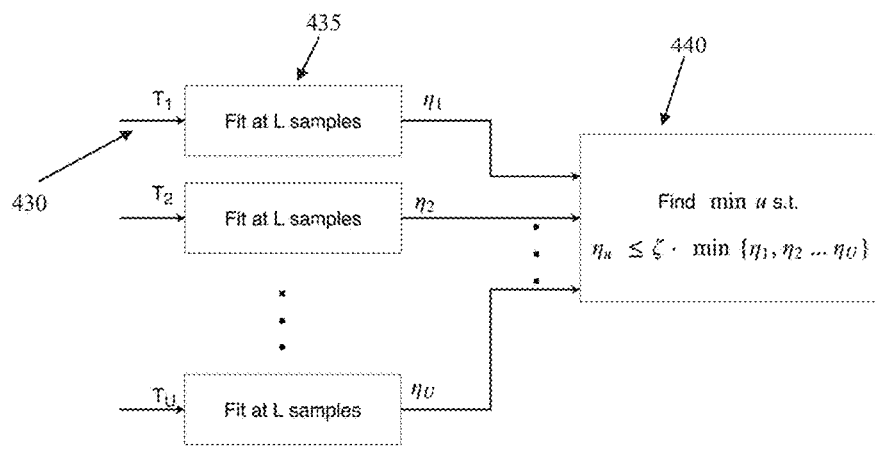
FIG. 19C

SYSTEM AND METHOD FOR FAST COMPRESSION OF OFDM CHANNEL STATE INFORMATION (CSI) BASED ON CONSTANT FREQUENCY SINUSOIDAL APPROXIMATION

CROSS REFERENCE TO RELATED APPLICATIONS

This application claims priority to currently U.S. Provisional Patent Application No. 62/295,871 filed on Feb. 16, 2016 and entitled, "Fast Compression of the OFDM Channel State Information (CSI) Based on Constant Frequency Sinusoidal Approximation".

BACKGROUND OF INVENTION

Today, the demand on higher speed of Wi-Fi is driven by the need to support more applications at higher quality. The Wi-Fi protocol has been constantly updated to meet such demands with newer technologies, such as adopting Orthogonal Frequency Division Multiplexing (OFDM) since 802.11a, Multiple-Input-Multiple-Output (MIMO) since 802.11n, and Multi-User MIMO (MU-MIMO) with the latest 802.11ac. One of the major barriers to fully exploiting new technologies such as MU-MIMO, or beamforming with single user MIMO, is the high overhead of the Channel State Information (CSI) feedback. The CSI for an antenna pair is a vector of complex numbers representing the channel coefficients of the OFDM subcarriers, and is the key to calculating the modulation parameters for the data transmission. In Wi-Fi, the CSI is typically measured at the receiver and is transmitted back to the sender, which requires significant overhead. For example, the full CSI for a single antenna pair on a 20 MHz channel has 64 complex numbers; if there are 9 antenna pairs, the full CSI has 9 vectors with 576 complex numbers which may exceed 1000 bytes.

The Wi-Fi standard defines options to compress the CSI, such as reducing the quantization accuracy or the number of subcarriers in the feedback, or using the Given's rotation on the V matrix after the Singular Value Decomposition (SVD) of the CSI matrix. However, these methods either reduce the accuracy of the CSI, or only achieve modest compression ratios. For example, a 3 by 3 complex V matrix can only be compressed into 6 real numbers, at a compression ratio of 3. The need for CSI feedback reduction in wireless networks in general is well known in the art.

As such, while there have been many attempts to compress the CSI to reduce the overhead, such as reducing the quantization accuracy or the number of subcarriers in the feedback, or using the sinusoidal representation of the CSI, the existing solutions either sacrifice accuracy or exhibit high computational complexity.

Accordingly, what is needed in the art is an improved system and method for compressing the CSI for OFDM that is accurate and computationally easy to implement.

SUMMARY OF INVENTION

In various embodiments, the present invention provides a system and method, referred to as CSIApx, which is a very fast and lightweight method to compress the Channel State Information (CSI) of Wi-Fi networks. In various embodiments, CSIApx approximates the CSI vector as the linear combination of a small number of base sinusoids on constant frequencies and uses the complex coefficients of the base sinusoids as the compressed CSI. While it is well-known that the CSI vector can be represented as the linear combination of sinusoids, fixing the frequencies of the base sinusoids is the key novelty of CSIApx, which is guided by the mathematical finding that almost any sinusoid can be approximated by the same set of base sinusoids with small bounded error. CSIApx enjoys very low computation complexity, because the key steps in the compression can be pre-computed. Extensive testing of CSIApx with both experimental and synthesized Wi-Fi channel data confirms that CSIApx can achieve very good compression ratio with little loss of accuracy.

In one embodiment, the present invention provides, a method for compressing channel state information (CSI) of a wireless channel, which includes, receiving, at a receiver of a wireless communication system, an orthogonal frequency division multiplexing (OFDM) wireless signal over a wireless channel and measuring at a receiver of a wireless communication system comprising one or more antenna pair, a channel state information (CSI) vector of the wireless channel from the received OFDM wireless signal for each antenna pair, wherein the CSI vector is an N by 1 vector of complex numbers and wherein each complex number represents an amplitude and a phase of one of N orthogonal frequency division multiplexing (OFDM) subcarriers of the wireless channel. The method further includes, accessing a plurality of configurations stored at the receiver, wherein each of the plurality of configurations "u", identifies a set of $P_u$ base sinusoid vectors on constant frequencies and wherein $P_u$ is the order of the configuration and is equal to the number of complex numbers of the compressed CSI if configuration u is selected, calculating, for each of the plurality of configurations, a dot product of the N by 1 CSI vector and a conjugate of each $P_u$ base sinusoid vector identified by the selected configuration to generate a $P_u$ by 1 projection vector, calculating, for each of the plurality of configurations, a product of a constant $P_u$ by $P_u$ matrix stored at the receiver and the $P_u$ by 1 projection vector to generate a $P_u$ by 1 coefficient vector and calculating, for each of the plurality of configurations, a minimum squared error (MSE) fit with the $P_u$ by 1 coefficient vector on L evenly-spaced locations where L is smaller than N, by multiplying each of the $P_u$ base sinusoids with the corresponding coefficient in the coefficient vector and taking the summation, at each of the L evenly-spaced locations. The final step of the compression is to select configuration u and use its $P_u$ by 1 coefficient vector as the output, if the total fit residual of the MSE fit of configuration u is below a predetermined threshold times the minimum fit residual among all configurations, and u is such a configuration with the lowest order. The compressed CSI is transmitted to the transmitter of the wireless communication system, which may decompress the CSI by computing a linear combination of the base sinusoids, based upon the decompressed CSI.

In another embodiment, the present invention provides a wireless communication system for compressing channel state information (CSI) of a wireless system. The system of the present invention includes, a receiver for receiving an orthogonal frequency division multiplexing (OFDM) wireless signal over a wireless channel. The receiver is configured for measuring a channel state information (CSI) vector of the wireless channel from the received OFDM wireless signal, wherein the CSI vector for each antenna pair is an N by 1 vector of complex numbers and wherein each complex number represents an amplitude and a phase of one of N OFDM subcarriers of the wireless channel, accessing a plurality of configurations stored at the receiver, wherein each of the plurality of configurations "u" identifies a set of $P_u$ base sinusoid vectors on constant frequencies and wherein $P_u$ is the order of the configuration and is equal to the number of complex numbers of the compressed CSI if configuration u is selected. The receiver is further configured for calculating, for each of the plurality of configurations, a dot product of the N by 1 CSI vector and a conjugate of each $P_u$ base sinusoid vector identified by the selected configuration to generate a $P_u$ by 1 projection vector, for calculating, for each of the plurality of configurations, for each of the plurality of configurations, a product of a constant $P_u$ by $P_u$ matrix stored at the receiver and the $P_u$ by 1 projection vector to generate a $P_u$ by 1 coefficient vector, for calculating, for each of the plurality of configurations, a minimum squared error (MSE) fit with the $P_u$ by 1 coefficient vector on L evenly-spaced locations where L is smaller than N, by multiplying each of the $P_u$ base sinusoids with the corresponding coefficient in the coefficient vector and taking the summation, at each of the L evenly-spaced locations. The receiver is further configured for selecting configuration u and use its $P_u$ by 1 coefficient vector as the output, if the total fit residual of the MSE fit of configuration u is below a predetermined threshold times the minimum fit residual among all configurations, and u is such a configuration with the lowest order. The compressed CSI is transmitted to the transmitter of the wireless communication system, which may decompress the CSI by computing a linear combination of the base sinusoids, based upon the decompressed CSI.

In another embodiment, the present invention provides a non-transitory computer-readable recording medium storing a computer program used for executing a channel state information (CSI) compressing operation of an Orthogonal Frequency Division Multiplexing (OFDM) wireless channel of a wireless communication system. The computer program causes a wireless communication system to receive, at a receiver of the wireless communication system, an OFDM wireless signal over a wireless channel, to measure, at a receiver of the wireless communication system, a channel state information (CSI) vector of the wireless channel from the received OFDM wireless signal for each antenna pair, wherein the CSI vector is an N by 1 vector of complex numbers and wherein each complex number represents an amplitude and a phase of one of N OFDM subcarriers of the wireless channel and to access a plurality of configurations stored at the receiver, wherein each of the plurality of configurations "u" identifies a set of $P_u$ base sinusoid vectors on constant frequencies and wherein $P_u$ is the order of the configuration and is equal to the number of complex numbers of the compressed CSI if configuration u is selected. The computer program further causes the receiver of the wireless communication system to calculate, for each of the plurality of configurations, a dot product of the N by 1 CSI vector and a conjugate of each $P_u$ base sinusoid vector identified by the selected configuration to generate a $P_u$ by 1 projection vector, to calculate, for each of the plurality of configurations, a product of a constant $P_u$ by $P_u$ matrix stored at the receiver and the $P_u$ by 1 projection vector to generate a $P_u$ by 1 coefficient vector, and to calculate, for each of the plurality of configurations, a minimum squared error (MSE) fit with the $P_u$ by 1 coefficient vector on L evenly-spaced locations where L is smaller than N, by multiplying each of the $P_u$ base sinusoids with the corresponding coefficient in the coefficient vector and taking the summation, at each of the L evenly-spaced locations. The computer program further causes the receiver of the wireless communication system to select configuration u and use its $P_u$ by 1 coefficient vector as the output, if the total fit residual of the MSE fit of configuration u is below a predetermined threshold times the minimum fit residual among all configurations, and u is such a configuration with the lowest order. The computer program further causes the receiver to transmit the compressed CSI to the transmitter of the wireless communication system. The computer program further causes the transmitter of the wireless communication system to decompress the CSI by computing a linear combination of the base sinusoids, based upon the compressed CSI.

The system and method of the present invention provides a novel CSI compression method for wireless networks based upon a rigid mathematical foundation which provides, a high compression ratio with a low loss of accuracy, a very low computation complexity which is suitable for hardware implementation, a small range of compressed data that is easy to quantize and to transmit and a solution that is resistant to noise in the channel.

The system and method employing the CSIApx technology in accordance with the present invention serves as a strong candidate for a CSI compression methodology for future wireless protocols to be implemented in hardware, and significantly improve the capability of the wireless transmitter to acquire the most recent CSI and achieve higher transmission speed. In accordance with the present invention, a novel system and method to compress the CSI vector in a wireless transceiver is described and referred to herein as CSIApx.

Accordingly, the present invention provides an improved system and method for compressing the CSI for OFDM wireless signals that is accurate and computationally easy to implement.

BRIEF DESCRIPTION OF THE DRAWINGS

For a fuller understanding of the invention, reference should be made to the following detailed description, taken in connection with the accompanying drawings, in which:

FIG. 9A is a graphical illustration of a typical fit by CSIApx in a typical indoor environment with around 100 ns delay spread, in accordance with an embodiment of the present invention.

FIG. 9B is a graphical illustration of a typical fit by CSIApx in a typical indoor environment with around 200 ns delay spread, in accordance with an embodiment of the present invention.

FIG. 9C is a graphical illustration of a typical fit by CSIApx in a typical indoor environment with around 400 ns delay spread, in accordance with an embodiment of the present invention.

FIG. 9D is a graphical illustration of a typical fit by CSIApx in a typical indoor environment with around 800 ns delay spread, in accordance with an embodiment of the present invention.

FIG. 19A is a diagram illustrating a first step of the functionality of the CSI compression circuitry of the receiver of the wireless communication system, in accordance with an embodiment of the present invention.

FIG. 19B is a diagram illustrating a second step of the functionality of the CSI compression circuitry of the receiver of the wireless communication system, in accordance with an embodiment of the present invention.

FIG. 19C is a diagram illustrating a third step of the functionality of the CSI compression circuitry of the receiver of the wireless communication system, in accordance with an embodiment of the present invention.

DETAILED DESCRIPTION OF THE INVENTION

Figure 1A:
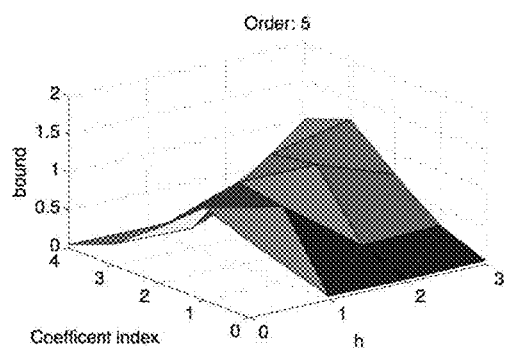
FIG. 1A is a graphical illustration of the bound of the coefficients with an order of 5 of Direct Fit, in accordance with an embodiment of the present invention.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

OFDM is the choice of modulation for broadband wireless networks today. In OFDM, entire communication frequency bandwidth is divided into equal size chunks, where the center of each chunk is called a subcarrier. A subcarrier can be considered as a pure sinusoid on a certain frequency, the amplitude and phase of which are set based on the values of the data bits. The CSI of a subcarrier is basically the amplitude and phase of the subcarrier observed by the receiver, when the sender transmits the unchanged subcarrier. If there is only one path from the sender to the receiver, the phases of the CSI of adjacent subcarriers will differ by the same amount, which is the phase difference due to the difference in frequencies over the same path length. Therefore, the CSI of all subcarriers will be a sinusoid. A typical wireless environment has multiple paths, therefore the CSI is the summation of multiple sinusoids.

Regarding the proof of the theorems supporting the present invention, the following detailed description proves that a target sinusoid on frequency g can be approximated as the linear combination of P base sinusoids, within certain error, under certain conditions. Therefore, the summation of many sinusoids, such as the CSI vector, can still be approximated as the linear combination of only P base sinusoids.

To approximate the target sinusoid, the existence of polynomial approximation of sinusoids is used, such as those according to the Taylor series expansion, as a stepping stone. That is, if the target sinusoid can be approximated by a polynomial of degree P−1, within certain error, it can also be approximated by P base sinusoids, within comparable error, because coefficients for the base sinusoids can be found by solving a linear system guaranteed to be nonsingular and the coefficients are bounded by constants. Although it may appear from the proof that the sinusoidal approximation is only as good as the polynomial approximation, in practice, it is preferred to use sinusoids to approximate a sinusoid because they belong to the same function family which significantly eases the numerical computations. The frequencies of the base sinusoids are not very sensitive to g, making it possible to preselect constant base sinusoids to match a range of the target frequencies to simplify the computation. The linear combination of the base sinusoids is called a fit, and the number of base sinusoids the order. The fit error refers to the difference between the fit and the CSI vector, and the fit residual is the squared norm of the fit error vector.

It can be said that, cos(Fx) with x in [0,1] can be approximated by a polynomial with degree P−1 and deviation $\xi^{F,P}$, if a polynomial $$\Phi^{F,P}(Fx) = \sum_{l=0}^{P-1} \eta_l^{F,P}(Fx)^l$$

can be found such that $$\max\{|\cos(Fx) - \Phi^{F,P}(Fx)|\} \leq \xi^{F,P},$$

where $\eta_l^{F,P}$ are constants determined by F and P. F is intentionally separated from $\eta_l^{F,P}$ because the same polynomial can be reused for lower frequencies; that is, for any f<F, using $\sum_{l=0}^{P-1} \eta_l^{F,P}(fx)^l$ as the approximation for cos(fx) will lead to deviation no more than $\xi^{F,P}$, because [0,f] ⊂ [0, F].

It is important to note that the proof does not need the exact values of $\eta_l^{F,P}$, and only needs the existence of the polynomial approximation. It is well established that polynomial approximation exists, such as the one according to the Taylor series expansion. Further optimizations can be made to minimize P for a given desired deviation by solving minimum square error problems. However, polynomial approximation can be difficult to find numerically in practice due to the errors accumulated in the computation, because the optimization problem has to handle values with very large range, which is why sinusoidal approximation is preferred.

First focusing on the approximation of one target sinusoid.

Theorem 1 cos(gx) for x∈[0,1] and g in [0,F] can be approximated with deviation $\xi^{F,P}$ as the linear combination of $\Phi^{F,P}(f_1x)$, $\Phi(f_2x), \ldots, \Phi^{F,P}(f_Px)$, where $f_1, f_2 \ldots, f_P$ are distinct values in [0,F], and the coefficient of $\Phi^{F,P}(f_kx)$ in the linear combination is $$\prod_{h=1, h\neq k}^{P} \frac{f_h - q}{f_h - f_k}.$$

Proof.

Clearly, if the linear combination of $\Phi^{F,P}$ $(f_1x)$, $\Phi^{F,P}$ $(f_2x), \ldots, \Phi^{F,P}$ $(f_Px)$ can exactly reproduce $\Phi^{F,P}$ (gx), cos(gx) can be approximated with deviation $\xi^{F,P}$. Denote the coefficient for $\Phi^{F,P}(f_k x)$ as $\gamma_k$ for $1 \le k \le P$. To reproduce $\Phi^{F,P}(gx)$ is to find coefficients such that $$\sum_{k=1}^{P} \gamma_k f_k^t = g^t$$

for all l; that is, the coefficients have to satisfy P linear equations:

$$\begin{bmatrix} 1 & 1 & \cdots & 1 \\ f_1 & f_2 & \cdots & f_P \\ f_1^2 & f_2^2 & \cdots & f_P^2 \\ \vdots & & & \\ f_1^{P-1} & f_2^{P-1} & \cdots & f_P^{P-1} \end{bmatrix} \begin{bmatrix} \gamma_1 \\ \gamma_2 \\ \gamma_3 \\ \vdots \\ \gamma_P \end{bmatrix} = \begin{bmatrix} 1 \\ g \\ g^2 \\ \vdots \\ g^{P-1} \end{bmatrix} \quad (1)$$

The matrix is a Vandermonde matrix with determinant $$\prod_{1 \le h < k \le P} (f_k - f_h);$$

therefore, as long as $f_1, f_2, \ldots, f_P$ are distinct, the determinate is not 0, and the solution always exists.

For convenience, denote $f_k - g$ as $d_k$. To obtain the values of $\gamma_k$, it is first proved that for any $\gamma_k$ that satisfies the linear system in Eq. 1 must satisfy $$\begin{bmatrix} 1 & 1 & \cdots & 1 \\ d_1 & d_2 & \cdots & d_P^1 \\ d_1^2 & d_2^2 & \cdots & d_P^2 \\ \vdots & & & \\ d_1^{P-1} & d_2^{P-1} & \cdots & d_P^{P-1} \end{bmatrix} \begin{bmatrix} \gamma_1 \\ \gamma_2 \\ \gamma_3 \\ \vdots \\ \gamma_P \end{bmatrix} = \begin{bmatrix} 1 \\ 0 \\ 0 \\ \vdots \\ 0 \end{bmatrix} \quad (2)$$

To show this, note that the first equation in Eq. 2 is identical to that in Eq. 1. For other equations, note that $$\sum_{k=1}^{P} \gamma_k (f_k - g)^h = \sum_{k=1}^{P} \gamma_k \sum_{t=0}^{h} [(-1)^{h-t} f_k^t g^{h-t} C(h,t)]$$

$$= \sum_{t=0}^{h} \sum_{k=1}^{P} [(-1)^{h-t} \gamma_k f_k^t g^{h-t} C(h,t)]$$

$$= \sum_{t=0}^{h} \left[ (-1)^{h-t} g^{h-t} C(h,t) \sum_{k=1}^{P} \gamma_k f_k^t \right]$$

$$= \sum_{t=0}^{h} [(-1)^{h-t} g^{h-t} C(h,t) g^t]$$

$$= (g - g)^h = 0,$$

therefore the claim is proved. According to linear algebra, $\gamma_k$ is the ratio of the determinant of the following matrix $$M_k = \begin{bmatrix} 1 & 1 & \cdots & 1 & 1 & 1 & \cdots & 1 \\ d_1 & d_2 & \cdots & d_{k-1} & 0 & d_{k+1} & \cdots & d_P \\ d_1^2 & d_2^2 & \cdots & d_{k-1}^2 & 0 & d_{k+1}^2 & \cdots & d_P^2 \\ \vdots & & & & & & & \\ d_1^{P-1} & d_2^{P-1} & \cdots & d_{k-1}^{P-1} & 0 & d_{k+1}^{P-1} & \cdots & d_P^{P-1} \end{bmatrix}$$

and the determinate of the matrix in Eq. 2. Using the cofactor expansion on column k, it can be found that $$\det M_k = \prod_{1 \le m \le P, m \ne k} d_m \prod_{1 \le n < m \le P, m, n \ne k} (d_m - d_n)$$

Therefore, $$\gamma_k = \prod_{h=1, h \ne k}^{P} \frac{f_h - g}{f_h - f_k} \quad (3)$$

Theorem 1 basically shows that a target sinusoid can be approximated as the linear combination of the polynomial approximations of the base sinusoids. However, in the present invention, the main interest is to approximate the target sinusoid by the base sinusoids. An obvious approach is to multiply base sinusoids by the coefficient values stated in Eq. 3, i.e., replacing the polynomial approximations by the base sinusoids themselves, and use the summation as the approximation, which is referred to as the Direct Fit. The Direct Fit will also have bounded error, if the coefficients are bounded, which is proved by the following theorem.

Theorem 2

Assume the frequencies of the base sinusoids are evenly distributed, i.e., $$f_k = \frac{(k-1)F}{P-1}.$$

Let $$g = \frac{(h+\delta)F}{P-1},$$

where $\delta \in [0,1]$ and h is an integer in $[0, P-2]$.

For $$h < \frac{P-1}{2},$$

$|\gamma_k|$ is bounded by $\Theta(g, k)$ where $$\Theta(g, k) = \begin{cases} \dfrac{[(h+1)!][(P-1-h)!]^{\frac{P-h}{P-1-h}} (P-1-h)^{P-1-h}}{(h-k+2)(k-1)!(P-k)!(P-h)^{P-h}} \\ 1 \\ \dfrac{[(h+1)!][(P-1-h)!^{\frac{P-1-h}{P-2-h}}](P-2-h)^{P-2-h}}{(k-1)!(P-k)!(P-1-h)^{P-1-h}(k-1-h)^{\frac{P-1-h}{P-2-h}}} \end{cases}$$

for k<h+1, k=h+1, and k>h+1, respectively. For $$h \geq \frac{P-1}{2},$$

due to symmetry, $\Theta(g,k)=\Theta(F-g,P-k+1)$.

Proof.

It is first noted that Eq. 3 cancels all common terms between the numerator and the denominator, therefore, it is convenient to normalize $f_k$ to $k-1$ and $g$ to $h+\delta$ in this proof. If $k \leq h+1$, $$|\gamma_k| = \frac{\left[\prod_{t=1,t\neq h-k+1}^{h}(t+\delta)\right]\delta\left[\prod_{t=1}^{P-1-h}(t-\delta)\right]}{(k-1)!(P-k)!} =$$

$$\frac{\left[\prod_{t=1,t\neq h-k+1}^{h}(t+\delta)\right]\left[\prod_{t=1}^{P-1-h}\delta^{\frac{1}{P-1-h}}(t-\delta)\right]}{(k-1)!(P-k)!}$$

As $$\delta^{\frac{1}{P-1-h}}(t-\delta)$$

is maximized when $$\delta = \frac{t}{P-h},$$

results in $$|\gamma_k| \leq \frac{[(h+1)!][(P-1-h)!]^{\frac{P-h}{P-1-h}}(P-1-h)^{P-1-h}}{(h-k+2)(k-1)!(P-k)!(P-h)^{P-h}}$$

If $k=h+1$, $$|\gamma_{h+1}| = \frac{(h+\delta)\ldots(1+\delta)(1-\delta)\ldots(P-1-h-\delta)}{h!(P-1-h)!} =$$

$$\frac{\left[\prod_{t=1}^{h}(t^2-\delta^2)\right]\left[\prod_{t=h+1}^{P-1-h}(t-\delta)\right]}{h!(P-1-h)!} \leq 1$$

where the maximization occurs when $\delta=0$. If $k>h+1$, $$|\gamma_k| =$$

$$\frac{\left[\prod_{t=1}^{h}(t+\delta)\right]\delta\left[\prod_{t=1,t\neq k-1-h}^{P-1-h}(t-\delta)\right]}{(k-1)!(P-k)!} = \frac{\left[\prod_{t=1}^{h}(t+\delta)\right]\left[\prod_{t=1,t\neq k-1-h}^{P-1-h}\delta^{\frac{1}{P-2-h}}(t-\delta)\right]}{(k-1)!(P-k)!}$$

Using the same bounding technique as for $k<h+1$, it can be shown that $$|\gamma_k| \leq \frac{[h+1!]\left[(P-1-h)!^{\frac{P-1-h}{P-2-h}}\right](P-2-h)^{P-2-h}}{(k-1)!(P-k)!(P-1-h)^{P-1-h}(k-1-h)^{\frac{P-1-h}{P-2-h}}}$$

Theorem 2 bounds the amplitudes for one particular choice the base sinusoids, which is sufficient to prove the existence of bounded approximation. The bounding technique in the proof is simple, however is fairly good and usually is within a small factor of 2 or 3 to the actual value. It can be easily found that the coefficient absolute values are no more than 1 when P is 3 or less; for other typical values, FIG. 1 shows the bound according to Theorem 2, where it can be seen that the values are usually small, except for target frequencies near the ends, which still does not pose a serious problem in practice according to the evaluation, likely because most frequency components in these regions are very weak.

Combining Theorems 1 and 2, if $\cos(gx)$ is approximated by the Direct Fit with evenly spaced base sinusoids, the total deviation is bounded by the difference between $\cos(gx)$ and $\Phi^{F,P}(gx)$, which is bounded by $\xi^{F,P}$, plus the deviation of the polynomial approximation of the scaled bases, which for base k is bounded by $\xi^{F,P}\Phi(g,k)$. Therefore:

Theorem 3

There exists a sinusoidal approximation for $\cos(gx)$ with deviation $\xi^{F,P}[1+\Sigma_{k=1}^{P}\Theta(g,k)]$ using P base sinusoids, where $g\in[0,F]$, $x\in[0,1]$, and the base sinusoids have evenly spaced frequencies in $[0,F]$.

Figure 1B:
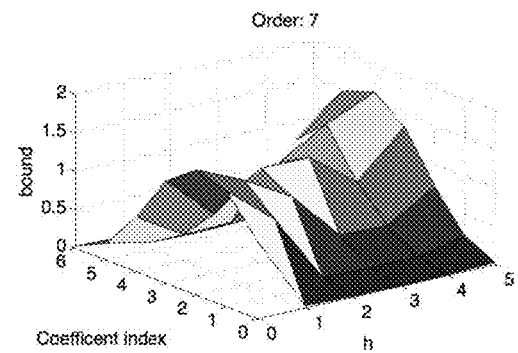
FIG. 1B is a graphical illustration of the bound of the coefficients with an order of 7 of Direct Fit, in accordance with an embodiment of the present invention.
Figure 1C:
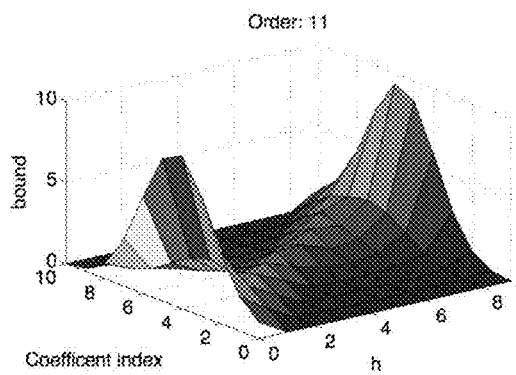
FIG. 1C is a graphical illustration of the bound of the coefficients with an order of 11 of Direct Fit, in accordance with an embodiment of the present invention.
Figure 1D:
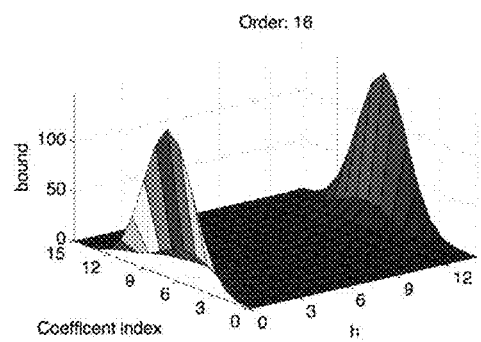
FIG. 1D is a graphical illustration of the bound of the coefficients with an order of 16 of Direct Fit, in accordance with an embodiment of the present invention.
Figure 2A:
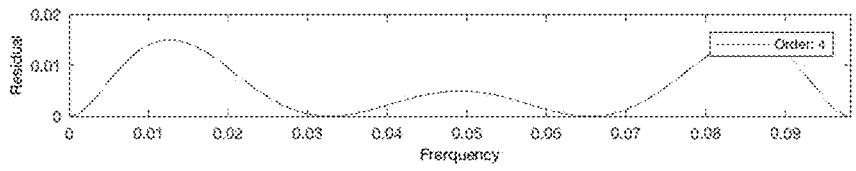
FIG. 2A is a graphical illustration of the fit residual of the Direct Fit for a single target sinusoid with unit amplitude matched with an order of 4, in accordance with an embodiment of the present invention.
Figure 2B:
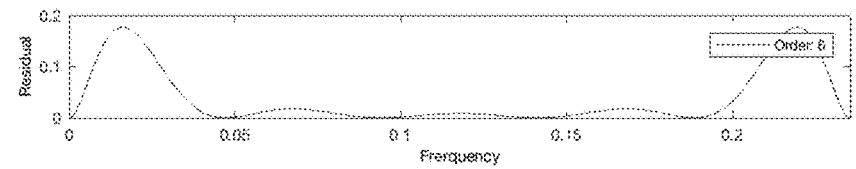
FIG. 2B is a graphical illustration of the fit residual of the Direct Fit for a single target sinusoid with unit amplitude matched with an order of 6, in accordance with an embodiment of the present invention.
Figure 2C:
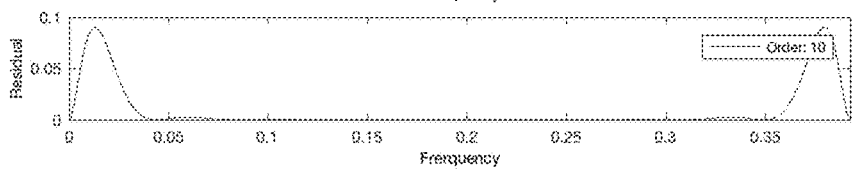
FIG. 2C is a graphical illustration of the fit residual of the Direct Fit for a single target sinusoid with unit amplitude matched with an order of 10, in accordance with an embodiment of the present invention.
Figure 2D:
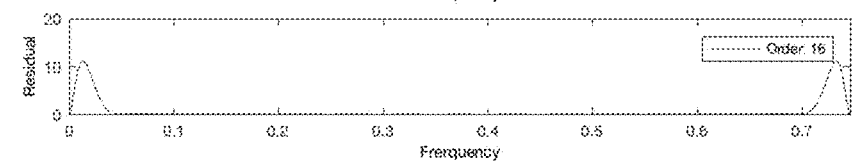
FIG. 2D is a graphical illustration of the fit residual of the Direct Fit for a single target sinusoid with unit amplitude matched with an order of 16, in accordance with an embodiment of the present invention.

It is important to note that as FIG. 1A-FIG. 1C suggests, the deviation according to Theorem 3 can be fairly small for a wide range of target frequencies, even when base sinusoids are on fixed and evenly spaced frequencies. In other words, it is not needed in practice to adjust the frequencies of the base sinusoids to match a target sinusoid to maintain a small approximation error, which can significantly simplify the operations in practice because many steps, such as finding the inverse of a matrix, can be pre-computed.

Several extensions to the above theorems will now be discussed. The focus so far has been on $\cos(gx)$ for x in $[0,1]$. However, the extension to $[-1,1]$ is immediate. That is, if the approximation matches $\cos(gx)$ in $[0,1]$, multiplying the base sinusoids by the same coefficients for values in $[-1,0]$ should also result in a match, because the target sinusoid and the base sinusoids have the same parity. Although this extension is very simple, it in effect doubles the range of the frequencies that can be approximated by P sinusoids.

The approximation for $\sin(gx)$ can use exactly the same coefficients as those for $\cos(gx)$. That is, given an approximation of $\cos(gx) \approx \Sigma_{k=1}^{P}\gamma_k \cos(f_k x)$ for $x\in[-1,1]$, $\sin(gx) \approx \Sigma_{k=1}^{P}\gamma_k \sin(f_k x)$ for $x\in[-1,1]$. This is because although the cosine and sine functions have different polynomial approximations, as long as Eq. 1 is satisfied, the coefficients for any exponent of x in the polynomial approximation are the same for target sinusoid and the linear combination of the base sinusoids.

The extension to complex wave $e^{igx}$ for $x\in[-1,1]$ is $$\sum_{k=1}^{P}\gamma_k \cos(f_k x) + i\sum_{k=1}^{P}\gamma_k \sin(f_k x) = \sum_{k=1}^{P}\gamma_k e^{if_k x}$$

The CSI vector is the summation of more than one sinusoid. However, as each sinusoid can be approximated, the summation can also be approximated as the summation of the individual approximations. The deterministic maximum deviation will be the summation of all individual deviations multiplied by the amplitude of the individual sinusoids, and may be large. However, in practice, the sinusoids have different phases and the deviation will almost never add up constructively, therefore the approximation error is small.

FIG. 2A-FIG. 2D shows the fit residual of the Direct Fit for a single target sinusoid with unit amplitude in several frequency ranges matched with different orders. The frequency is the amount of angular rotation between neighboring points and the target sinusoid vector has a total of 64 points with index from −32 to 31, matching the number of subcarriers in Wi-Fi. The frequencies of the base sinusoids are evenly spaced between 0 and the maximum frequency in each case. The orders in the figure are larger than the orders actually used in CSIApx for the same frequency range, because the Direct Fit is not optimal. Still, it can be seen that the fit residual is very small for most target sinusoid frequencies, such as around 0.01 or lower, which translates to only 0.00016 per data point. The residual is higher for target frequencies in the ends, matching our theoretical prediction. The good fit quality also indirectly confirms the existence of polynomial approximation with order P−1, because the Direct Fit matches the target sinusoid exactly in orders P−1 and lower in the polynomial approximation, therefore the error is contributed by the higher orders; as the error is small, the coefficients in the higher orders are bounded.

According to our theoretical findings, the CSI can be approximated by a linear combination of the base sinusoids. In practice, the coefficients of the base sinusoids can be found by solving a minimum square error problem to match the CSI as closely as possible. The fit is therefore called the MSE Fit, and requires very low computation complexity, mainly because the linear system to be solved in the optimization problem is defined by a constant matrix. As any sinusoid can be approximated in this manner, the simplest approach would be to select just one set of base sinusoids to be used for all CSI. However, different types of channels have different delay spreads, which translate to different frequency ranges of the sinusoids in the CSI, the larger the delay spread, the higher the frequency. As sinusoids on lower frequencies can be approximated with fewer base sinusoids, to further improve the compression ratio, CSIApx introduce a small number of configurations with different number of base sinusoids, and finds the fits for all configurations and selects a fit as the output, considering both compression ratio and fit residual. The complexity of calculating the fits are reduced by sharing certain base sinusoids among multiple configurations.

The very core of CSIApx is to find the coefficients of the MSE Fit, denoted as a vector $\Gamma$. Let Y denote the CSI vector and N the length of Y. The following explanation is for the case where the CSI vector is measured at N consecutive subcarriers. However, the same method can be easily extended to the case where the subcarriers are not consecutive by minimizing squared error only at the subcarriers with measurements; that is, fitting only the measured subcarriers. To minimize the squared error is to select coefficients to minimize $$J=\Sigma_{j=1}^{N}|(\Sigma_{k=1}^{P}\gamma_k e^{if_k j})-y_j|^2,$$

where P is the order, $\gamma_k$ and $f_k$ are the coefficient and frequency of base sinusoid k, respectively, $y_j$ is element j in the CSI vector Y. By taking the derivatives of J with respect to the coefficients and setting them to 0, $\Gamma$ that minimizes J is the solution to a linear system $Q\Gamma=S$, where:

Q is a P by P matrix, in which $q_{k,h}=\Sigma_{j=1}^{N}e^{i(f_h-f_k)j}$,

S is a P by 1 vector, in which $s_k=\Sigma_{j=1}^{N}e^{-if_k j}y_j$.

It can be seen that S is determined by the CSI vector, but is just the dot products of the CSI vector and the conjugate of the base sinusoids. On the other hand, as the frequency values are constants, $Q^{-1}$ is a constant matrix and can be precomputed. Therefore, after S is obtained, $\Gamma$ can be found by simply multiplying the constant matrix $Q^{-1}$ with S.

In an additional embodiment, CSIApx introduces U configurations to match Wi-Fi channel conditions. Configuration u is described by the frequencies of the $P_u$ base sinusoids it uses, denoted as $f_{u,k}$ for k=1, 2, . . . , $P_u$, where the definition of frequency is as previously defined.

CSIApx solves the constant linear system previously described to get the fit coefficients for each configuration, in parallel. Then, it calculates the MSE Fit on L evenly spaced sample locations for each configuration and finds the sampled fit residual for each configuration, denoted as $\eta_u$ for configuration u. CSIApx selects the fit coefficients of configuration u as the compressed CSI, if configuration u is the first configuration such that $\eta_u<\zeta \min(\eta_1, \eta_2, \ldots, \eta_U)$, where $\zeta$ is an empirical constant greater than 1.

To reduce the overall computation complexity, different configurations may share some common base sinusoids, because the main computation in CSIApx is actually finding the dot products between the base sinusoids and the CSI. Overall, let W be the total number of unique base sinusoids in all configurations, the complexity of CSIApx, measured the number of complex multiplications, includes only:

WN: for computing the dot products between the base sinusoids and the CSI $\Sigma_{u=1}^{U} P_u^2$: for finding the fit coefficients of all configurations $\Sigma_{u=1}^{U} (P_u+1)L$: for computing the fits at sampled locations and the sampled fit residuals The selection of the base sinusoids should consider multiple issues that are dependent on each other, such as compression ratio, accuracy, implementation cost, and the range of the fit coefficients. Fortunately, CSIApx is to be applied to wireless systems with a fixed number of subcarriers and well-studied channel conditions, such as Wi-Fi. Therefore, the parameters can be empirically chosen. As such, based on experience, for configuration u, the maximum base sinusoid frequency should be the maximum frequency $P_u$ base sinusoids can approximate well. Also, for each configuration, the base sinusoids should be more closely spaced in the lower part of the spectrum than the upper part, because more energy is in the lower part of the spectrum.

Table 1 shows exemplary choices targeting Wi-Fi channel with 64 subcarriers, in which there are 5 configurations with 27 unique base sinusoids, and $\zeta=1.75$. For 40 subcarriers used for evaluating the experimental data, the frequencies for configurations 1 to 5 are shown in Table 2, there are 5 configurations with 27 unique base sinusoids and $\zeta=4$.

TABLE 1

Configuration For 64 subcarriers

| u | $P_u$ | Frequencies |
|---|---|---|
| 1 | 3 | 0, 0.06, 0.12 |
| 2 | 5 | 0, 0.05, 0.1, 0.15, 0.25 |
| 3 | 7 | 0, 0.06, 0.12, 0.18, 0.24, 0.3, 0.42 |

TABLE 1-continued

Configuration For 64 subcarriers

| u | $P_u$ | Frequencies |
|---|---|---|
| 4 | 11 | 0, 0.06, 0.12, 0.18. 0.24, 0.3, 0.36, 0.42, 0.525, 0.6375, 0.75 |
| 5 | 16 | 0, 0.075, 0.15, 0.225, 0.3, 0.375, 0.45, 0.525, 0.6, 0.7, 0.8, 0.9, 1.0, 1.1, 1.2, 1.3 |

TABLE 2

Configuration For 40 subcarriers

| u | $P_u$ | Frequencies |
|---|---|---|
| 1 | 3 | 0, 0.05, 0.1 |
| 2 | 4 | 0, 0.06, 0.12, 0.2 |
| 3 | 6 | 0, 0.075, 0.15, 0.225, 0.3, 0.45 |
| 4 | 10 | 0, 0.075, 0.15, 0.225, 0.3, 0.375, 0.525, 0.675, 0.825, 0.975 |
| 5 | 14 | 0, 0.09, 0.18, 0.27, 0.36, 0.45, 0.575, 0.7, 0.825, 0.95, 1.075, 1.2, 1.325, 1.45 |

In practice, the raw measured CSI often has a shift frequency, which is a frequency value added to the frequencies of all sinusoids, caused by the sample timing offset to the OFDM symbol boundary. The shift frequency needs to be removed before running CSIApx, because it may force CSIApx to choose higher configurations to approximate sinusoids on higher frequencies and reduce the compression ratio. This can easily be achieved by multiplying the CSI with a sinusoid on the negative of the shift frequency, a process referred in the invention as "rotation". The value of the shift frequency is known to the wireless receiver, because it selects the OFDM symbol boundary. The frequency used in the rotation can also be slightly adjusted to make sure that the sinusoids in the CSI are still on positive frequencies after the rotation.

The implementation guideline of CSIApx described herein summarizes the earlier discussions and is for a given number of subcarriers in the Wi-Fi channel, denoted by N. The following explanation is for the case where the CSI vector is measured at N consecutive subcarriers; however, it can be easily extended to the case where the subcarriers are not consecutive, as explained earlier. It should also be noted that the same method applies to all possible values of N, except the values of the constants need to be adjusted.

The CSI vector Y is an N by 1 vector of complex numbers, where each number represents the amplitude and phase of the OFDM subcarrier. CSIApx supports U configurations. Configuration u selects a set of $P_u$ base sinusoids, which are sinusoids on constant frequencies, denoted as $f_{u,k}$ for k=1, 2, ..., $P_u$. To reduce the complexity, different configurations may share some common base sinusoids. If configuration u is selected by CSIApx, Y will be compressed into $P_u$ complex numbers. $P_u$ is called the order of configuration u.

The preprocessing steps of CSIApx are performed only once. A first preprocessing step includes, computing the original and conjugate of the base sinusoid vectors for all configurations. For example, the original base sinusoid vector k for configuration u is a sinusoid on frequency $f_{u,k}$ evaluated on N points. For any base sinusoid shared by multiple configurations, such computation is to be performed only once. In a second preprocessing step, for each configuration, say, configuration u, compute a $P_u$ by $P_u$ matrix $Q_u^{-1}$ which is a constant matrix and is the inverse of matrix $Q_u$, where element (k,h) is $\Sigma_{j=1}^{N} e^{i(f_{u,k}-f_{u,h})j}$.

Various methods are known in the art for measuring the CSI of the OFDM wireless signal at the receiver. The procedure of actual CSI measurement at the receiver is beyond the scope of the present invention. The present invention can successfully operate with any method of real-time CSI measurement, including, but not limited to, pilot based CSI measurement, blind SCI measure and data assisted n pilot based CSI measurement.

After using the existing method to measure the CSI of the OFDM wireless signal at the receiver, a first real-time compression step includes, for each configuration, say, configuration u: (a) Obtain the dot product of Y with the conjugate of each base sinusoid. Note that for any base sinusoid shared by multiple configurations, such computation is to be done only once. Store the results in a $P_u$ by 1 vector $S_u$, (b) Compute $\Gamma_u = Q_u^{-1} S_u$. Element k in $\Gamma_u$ is denoted as $T_{u,k}$, and (c) Compute the sampled fit at L evenly spaced locations. For example, for a location h, it is $\Sigma_{k=1}^{P_u} T_{u,k} e^{if_{u,k}h}$. Find the squared error of the sampled fit to Y at the sampled locations denoted as $\theta_u$. The second real-time compression step includes, picking $\Gamma_u$ as the compressed CSI, if configuration u is the first configuration such that $\eta_u u < \zeta \min\{\eta_1, \eta_2, \ldots, \eta_U\}$, where $\zeta$ is an empirical constant greater than 1.

Figure 3:
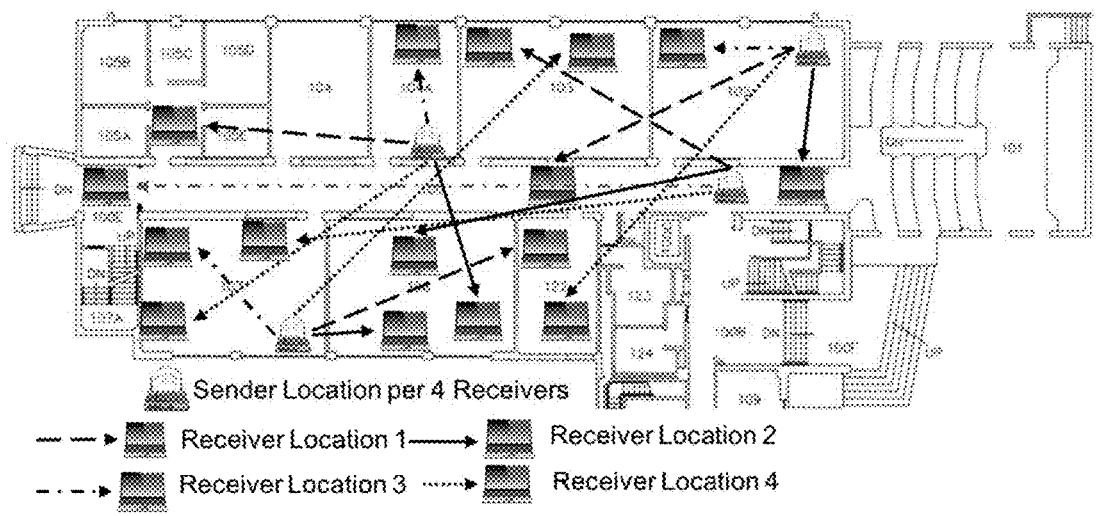
FIG. 3 illustrates locations of receivers and senders in various experimental locations, in accordance with embodiments of the present invention.

In various experimental embodiments, CSI data was collected using the Atheros CSITool installed on 2 laptops with the Atheros AR9462 wireless card with 2 antennas on 20 MHz channels. A total of 100 experiments in various location settings were conducted, which include typical environments like office buildings, apartment complexes, and large hallways. The experiments include both line of sight and non-line of sight cases as well as varying channel conditions due to human movements near the machines. Some of the experiments locations are shown in FIG. 3.

Figure 4:
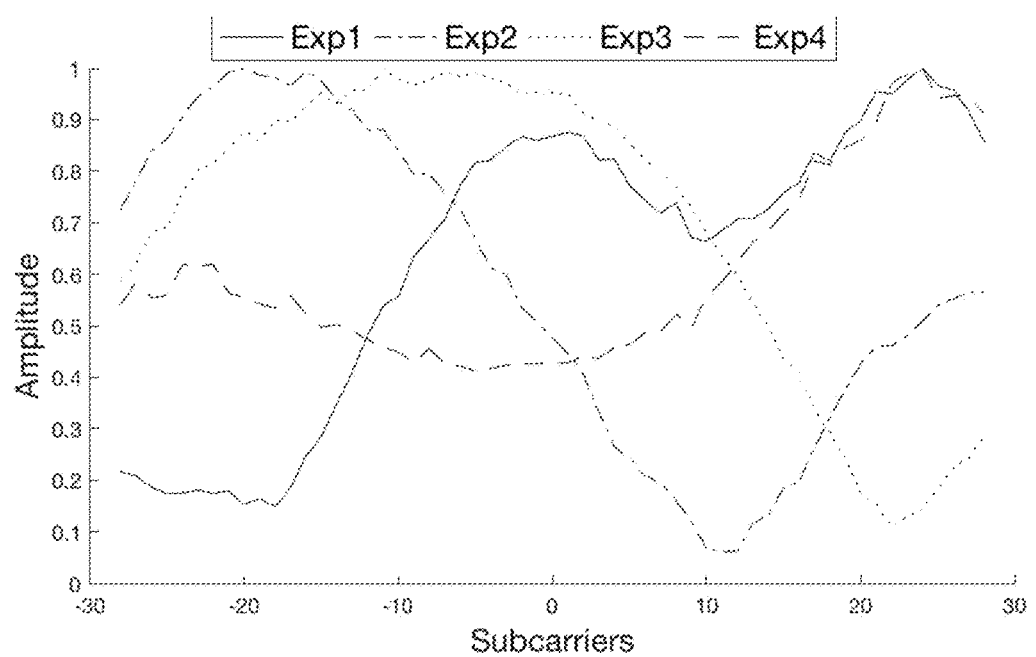
FIG. 4 is a graphical illustration of the absolute values of some raw CSI vectors, in accordance with embodiments of the present invention.

The CSITool reports the CSI on 56 selected subcarriers for 4 antenna pairs. FIG. 4 shows the absolute values of some raw CSI vectors, where it can be seen that the data has some level of noise. A few preprocessing steps were taken before passing the data for compression. First, as the signal always seems to be attenuated at both ends of the spectrum, caused most likely by additional filtering in hardware, not representing the characteristics of the actual channel, 8 subcarriers on both ends are removed, with only the middle 40 subcarriers kept. Secondly, as some of the experiments have very weak signals, measurements with RSSI (Received Signal Strength Indicator) lower than 30 dB are filtered out. Thirdly, the CSI data of all antenna pairs is normalized by a common factor such that the maximum amplitude is 1. Lastly, as explained before, each CSI vector is rotated to remove the shift frequency. A simple heuristic is used to estimate the shift frequency value, which is not reported by the current device to the driver level. The details of the heuristics is omitted; basically, it keeps rotating the CSI from the same transmitting antenna incrementally, until most energy appears to occupy only a spectrum starting from 0 up to some frequency for both receiving antennas. As it may over-rotate the CSI and lead to negative frequencies, when running CSIApx, the CSI for all antenna pairs are multiplied by a sinusoid with a positive frequency of 0.0491 to move most sinusoids in the CSI to positive frequency.

For comparison, the known CTDP (Continuous Time Domain Parameters) channel estimation was implemented. The CTDP iteratively selects a sinusoid that best matches the current residual signal, until the power of the selected sinusoid is below a threshold. CTDP is chosen because it is one of the more recent methods and has a good performance. As CTDP requires the noise power value, which needs to be estimated with the experimental data and the original CTDP design does not specify how the noise level is estimated, the fit residual found by CSIApx is used as the estimate of the total noise power, which should be very close. Another constrained version of CTDP, referred to as cCTDP, is also evaluated, with which the fit residuals of CTDP and CSIApx can be compared when using similar number of sinusoids. That is, with cCTDP, the number of sinusoids used is the smallest upper bound of the average number of sinusoids used by CSIApx for the same CSI measurement, noting that CSIApx may use different configurations for different antenna pairs. The frequency range of sinusoids scanned in CTDP and cCTDP is [−0.785,157], which should cover all frequencies in the CSI. It should also be mentioned that as CTDP has to solve an optimization problem to select the frequency of a sinusoid in each iteration, it has much higher implementation complexity than CSIApx, because CSIApx avoids this problem altogether by using constant frequencies.

Figure 5:
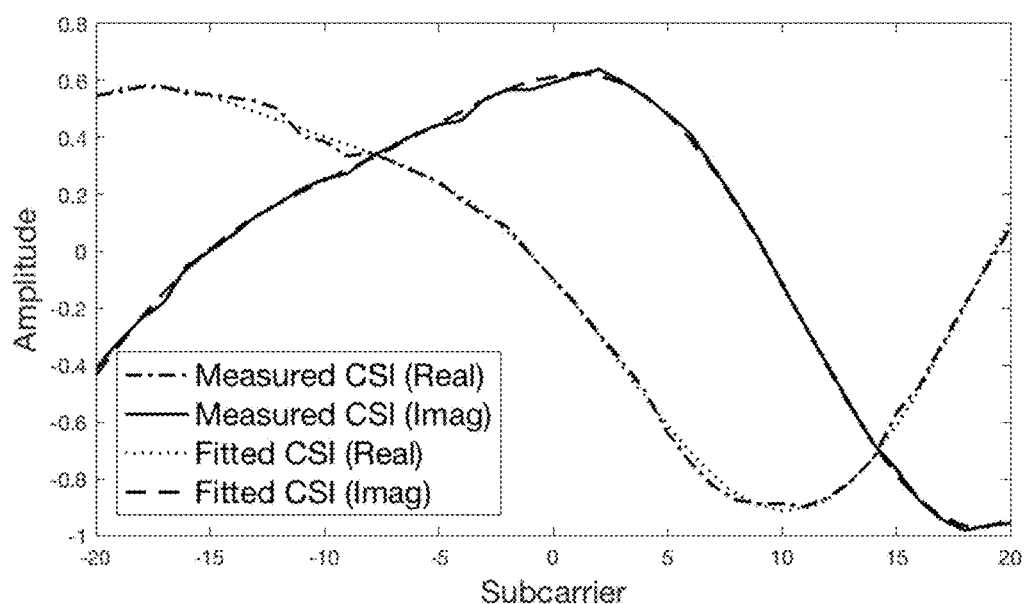
FIG. 5 is a graphical illustration of a typical fit by CSIApx in accordance with embodiments of the present invention, where it can be seen that the fitted curve follows closely to the actual CSI.

FIG. 5 shows a typical fit by CSIApx, where it can be seen that the fitted curve follows closely to the actual CSI. As the fit residual and the compression ratio are related, i.e., improving one is often at the cost of the other, they are jointly compared.

Figure 6A:
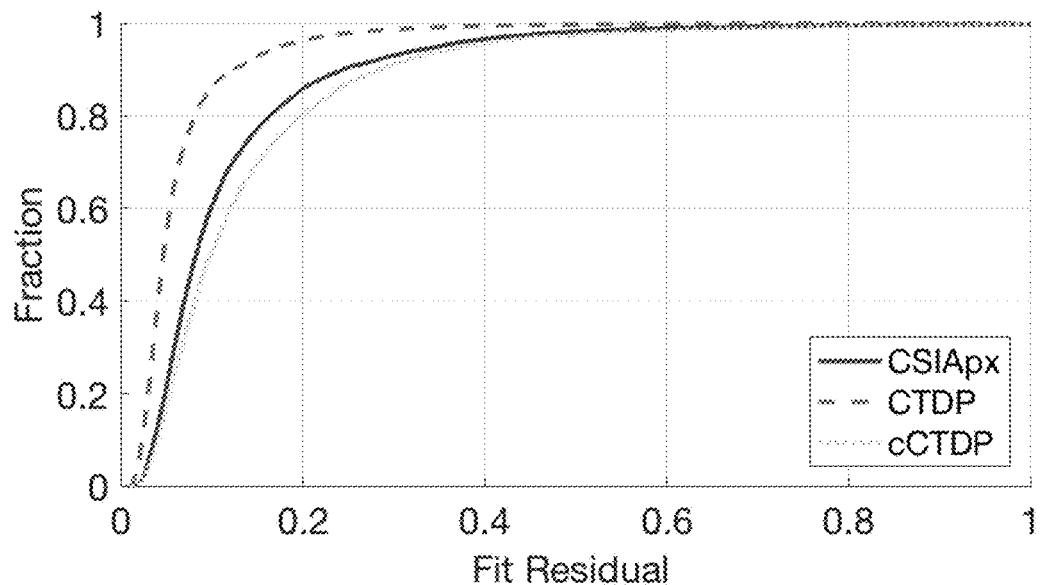
FIG. 6A is a graphical illustration of the Cumulative Density Function (CDF) of the total fit residual of all 4 antenna pairs in 7923 CSI measurements, in accordance with an embodiment of the present invention.
Figure 6B:
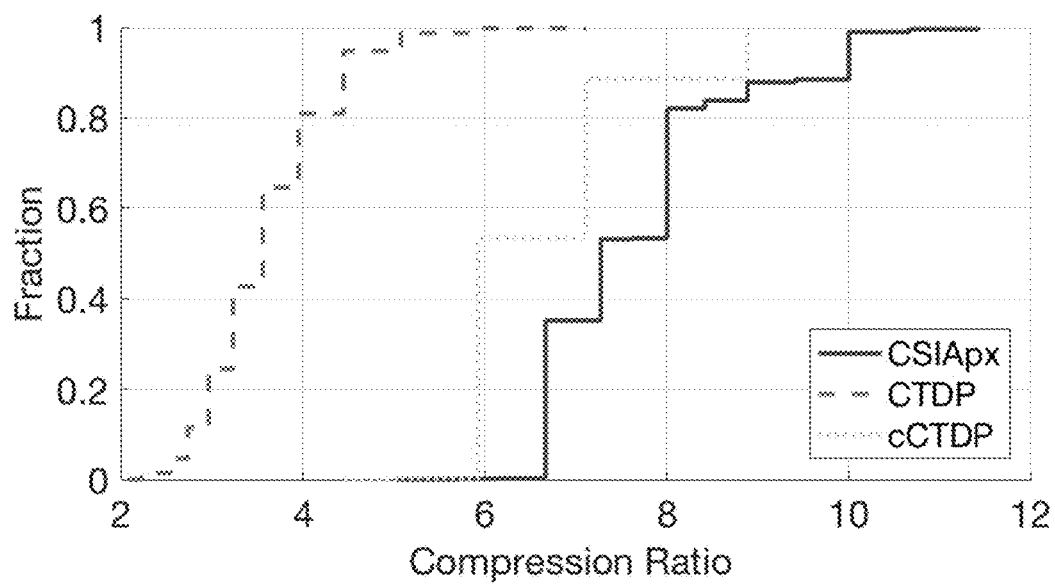
FIG. 6B is a graphical illustration of the compression ratio, defined as the ratio of the number of real numbers in the CSI vector over that needed by a compression method to describe the sinusoids, noting that a complex number consists of two real numbers, in accordance with an embodiment of the present invention.

FIG. 6A shows the Cumulative Density Function (CDF) of the total fit residual of all 4 antenna pairs in 7923 CSI measurements. FIG. 6B shows the compression ratio, defined as the ratio of the number of real numbers in the CSI vector over that needed by a compression method to describe the sinusoids, noting that a complex number consists of two real numbers.

It can be seen that the fit residual of CSIApx in most cases are very small with a median of 0.0828 for all antenna pairs, which translates to an error of 0.0005 per data point. The fit residual of CTDP is better with a median of 0.0467, however it is at a cost of a much lower compression ratio, as the average compression ratio of CSIApx against 40 subcarriers is 7.68, much better than CTDP, which is 3.59. Close examinations of the fits show that CSIApx actually fits the signal very well, and its fit residual is mainly the quantization noise, such as those shown in FIG. 6, which cannot be eliminated unless more sinusoids are introduced to fit the noise. In this sense, CSIApx achieves a better tradeoff between fit residual and compression. The better performance with CSIApx can also be seen from the cCTDP results, as cCTDP actually has higher fit residual, at the same time slightly lower compression ratio.

The end result of the compression method can be the MU-MIMO data rate of the users. In one embodiment, the MU-MIMO rate program is used, which first calculates the modulation parameters with the supplied imperfect CSI, then finds the achievable data rate when the selected parameters are used on the actual channel. The program is configured to use the greedy method for user selection and run at SNR of 20 dB. For each subcarrier, the program is run twice, feeding the compressed and the measured CSI to the program to obtain two values, representing total data rates to all users with imperfect and perfect CSI, respectively. The difference between the two, divided by the latter, is referred to as the "normalized rate difference", and is used as the metric.

In the experimental tests, a total of 1500 tests were run, where each test includes one sender and 2 receivers. In each test, the CSI collected from experiments where the sender was at a fixed location for 4 receivers is used and 2 receivers are randomly selected from the 4 actual receivers. As the link is 2 by 2 but each MU-MIMO receiver has only 1 antenna, the first antenna is selected for each receiver.

Figure 7:
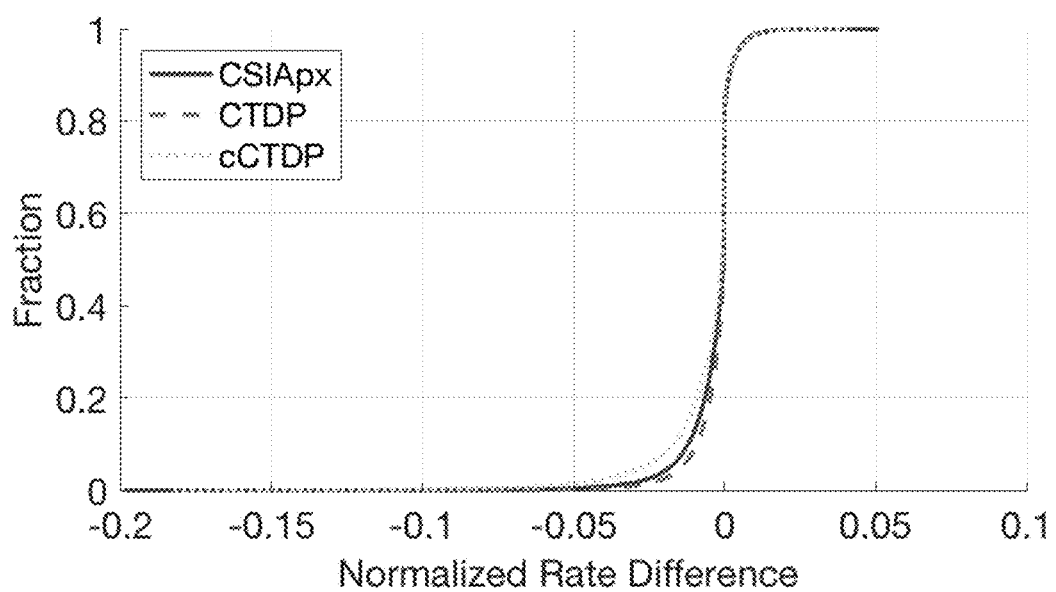
FIG. 7 is a graphical illustration of the CDF of the normalized rate difference in accordance with an embodiment of the present invention, where it can be seen that the rate difference with CSIApx is usually very small.

FIG. 7 illustrates the CDF of the normalized rate difference, where it can be seen that the rate difference with CSIApx is usually very small, e.g., within −3% and 3% in over 98.3% of the cases. CTDP performs better reporting 99.0%, but this comes at the cost of it's compression ratio. At similar compression ratio, cCTDP performs worse than CSIApx at 95.7%. The rate difference in some very rare cases can also be positive, because the greedy method sometimes selects different sets of users when given the compressed and measured CSI.

Figure 8:
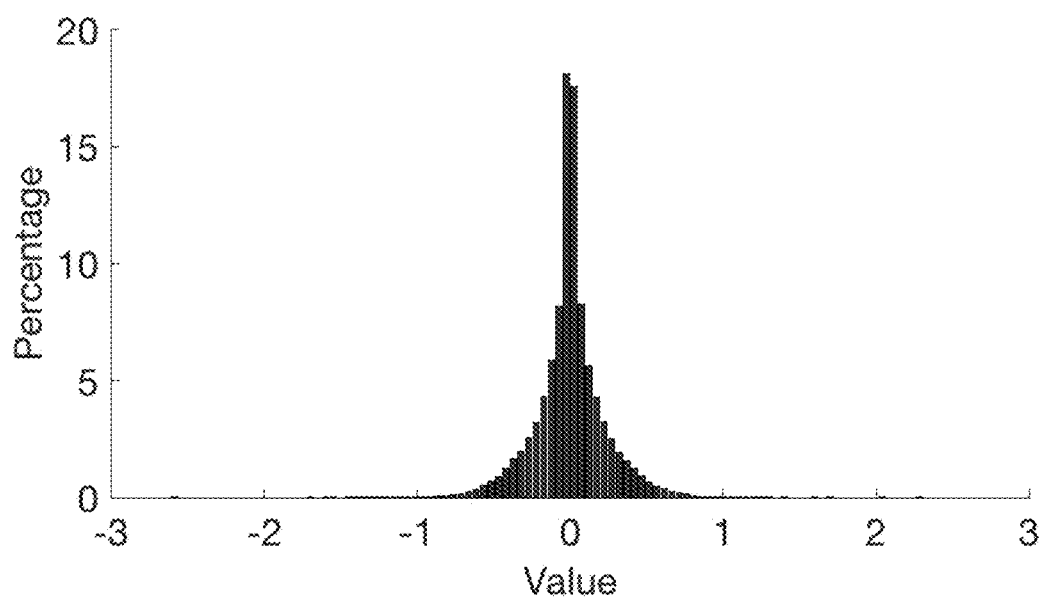
FIG. 8 illustrates the distribution of the real and imaginary parts of the coefficients found by CSIApx for the strongest antenna pair in each test case, in accordance with an embodiment of the present invention.
Figure 10A:
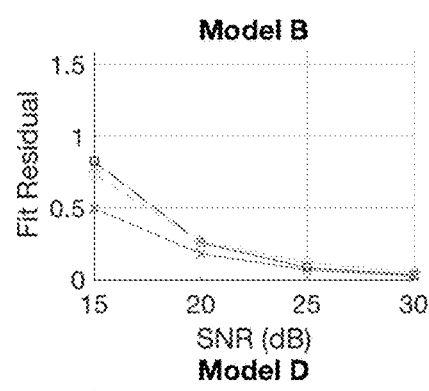
FIG. 10A is a graphical illustration of the mean of the total fit residual of all antenna pairs in a typical indoor environment with around 100 ns delay spread, in accordance with an embodiment of the present invention.
Figure 10B:
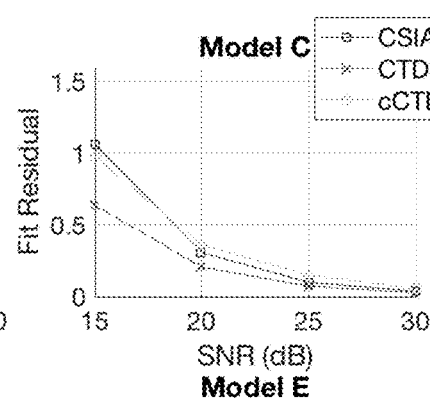
FIG. 10B is a graphical illustration of the mean of the total fit residual of all antenna pairs in a typical indoor environment with around 200 ns delay spread, in accordance with an embodiment of the present invention.
Figure 10C:
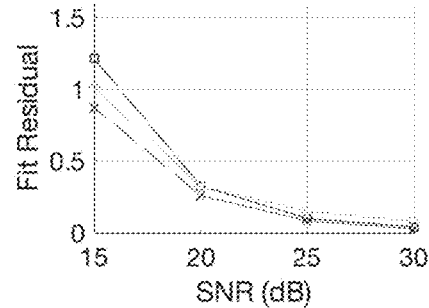
FIG. 10C is a graphical illustration of the mean of the total fit residual of all antenna pairs in a typical indoor environment with around 400 ns delay spread, in accordance with an embodiment of the present invention.
Figure 10D:
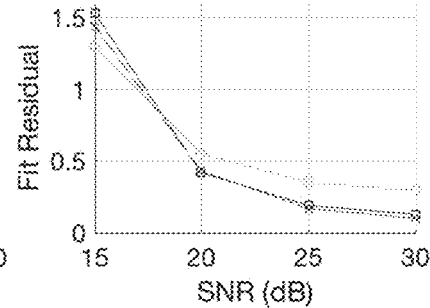
FIG. 10D is a graphical illustration of the mean of the total fit residual of all antenna pairs in a typical indoor environment with around 800 ns delay spread, in accordance with an embodiment of the present invention.
Figures 11A, 11B, 11C, 11D:
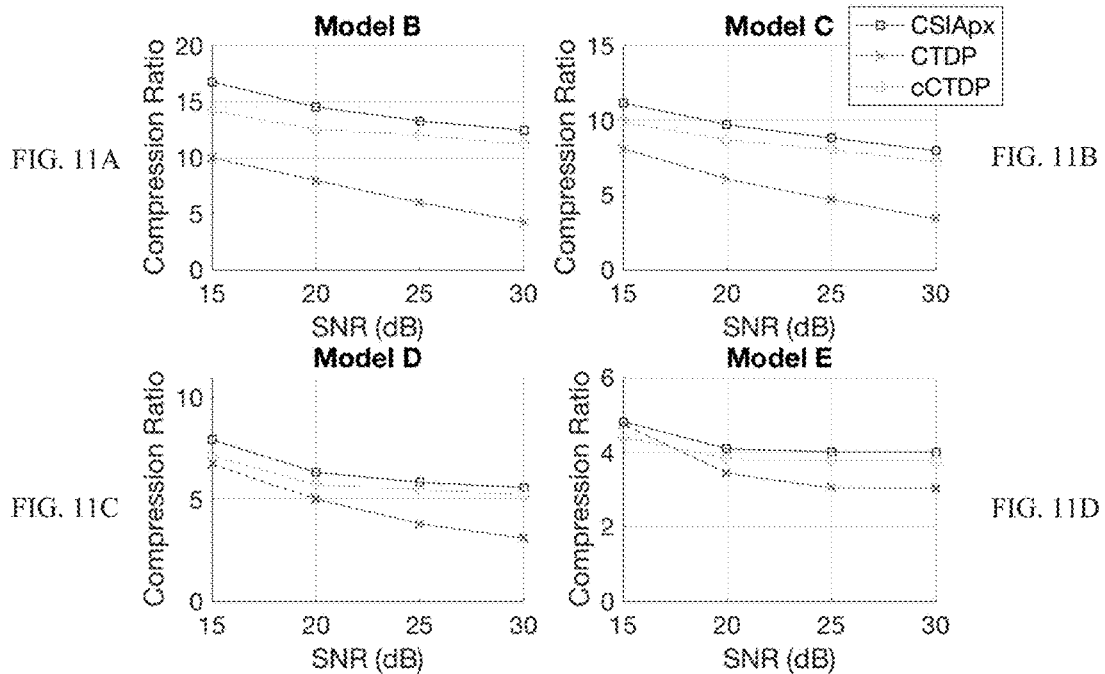
FIG. 11A is a graphical illustration of the average compression ratios in a typical indoor environment with around 100 ns delay spread, in accordance with an embodiment of the present invention.
FIG. 11B is a graphical illustration of the average compression ratios in a typical indoor environment with around 200 ns delay spread, in accordance with an embodiment of the present invention.
FIG. 11C is a graphical illustration of the average compression ratios in a typical indoor environment with around 400 ns delay spread, in accordance with an embodiment of the present invention.
FIG. 11D is a graphical illustration of the average compression ratios in a typical indoor environment with around 800 ns delay spread, in accordance with an embodiment of the present invention.
Figure 12A:
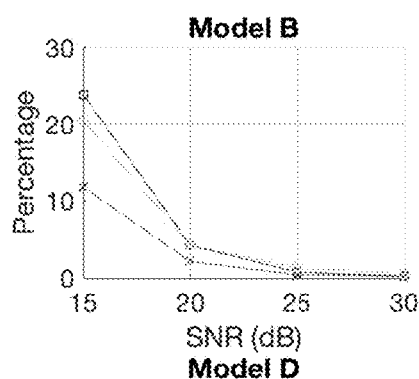
FIG. 12A is a graphical illustration of the percentage of cases that the normalized rate differences are above 3% or lower than −3% for an MU-MIMO rate in a typical indoor environment with around 100 ns delay spread, in accordance with an embodiment of the present invention.
Figure 12B:
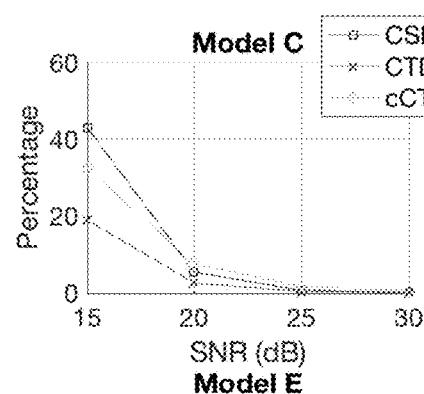
FIG. 12B is a graphical illustration of the percentage of cases that the normalized rate differences are above 3% or lower than −3% for an MU-MIMO rate in a typical indoor environment with around 200 ns delay spread, in accordance with an embodiment of the present invention.
Figure 12C:
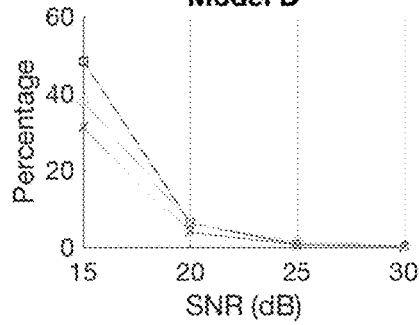
FIG. 12C is a graphical illustration of the percentage of cases that the normalized rate differences are above 3% or lower than −3% for an MU-MIMO rate in a typical indoor environment with around 400 ns delay spread, in accordance with an embodiment of the present invention.
Figure 12D:
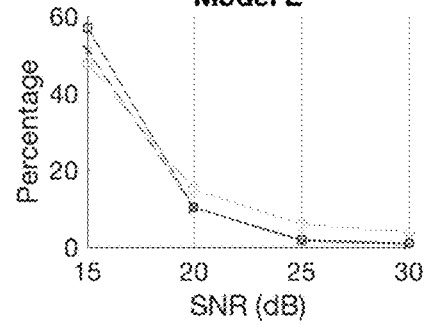
FIG. 12D is a graphical illustration of the percentage of cases that the normalized rate differences are above 3% or lower than −3% for an MU-MIMO rate in a typical indoor environment with around 800 ns delay spread, in accordance with an embodiment of the present invention.
Figure 13A:
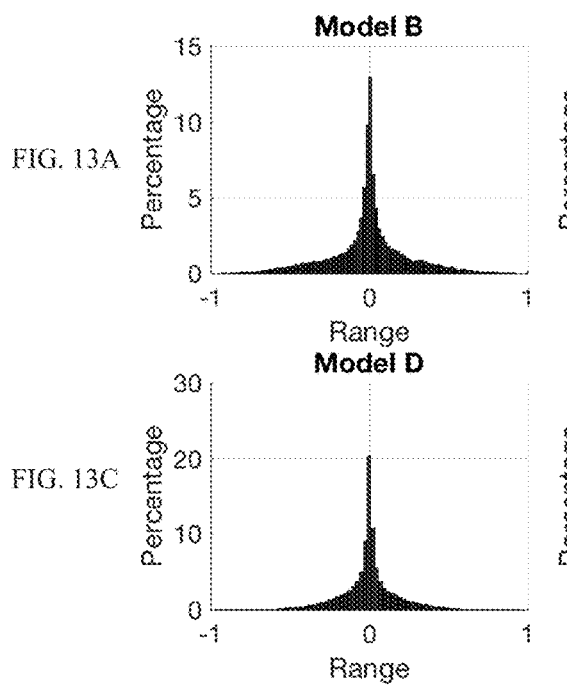
FIG. 13A shows the distribution of the fit coefficients by CSIApx for the strongest antenna pair in a typical indoor environment with around 100 ns delay spread, in accordance with an embodiment of the present invention.
Figure 13B:
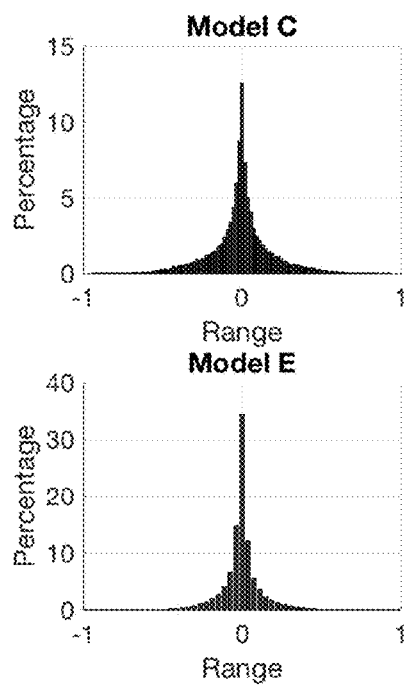
FIG. 13B shows the distribution of the fit coefficients by CSIApx for the strongest antenna pair in a typical indoor environment with around 200 ns delay spread, in accordance with an embodiment of the present invention.
Figure 13C:
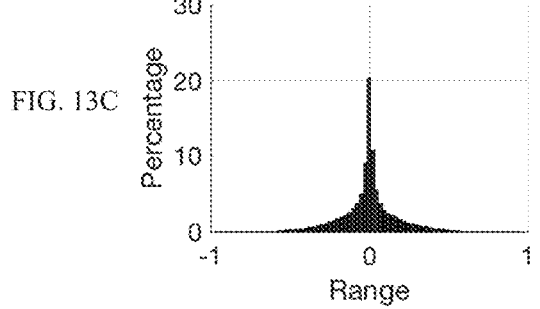
FIG. 13C shows the distribution of the fit coefficients by CSIApx for the strongest antenna pair in a typical indoor environment with around 400 ns delay spread, in accordance with an embodiment of the present invention.
Figure 13D:
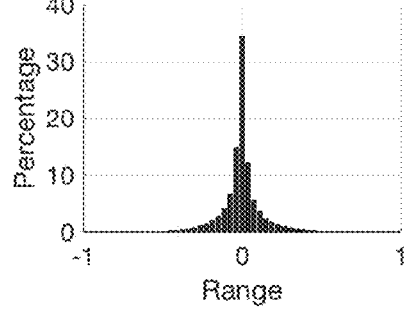
FIG. 13D shows the distribution of the fit coefficients by CSIApx for the strongest antenna pair in a typical indoor environment with around 800 ns delay spread, in accordance with an embodiment of the present invention.

One of the advantageous features of CSIApx is that the fit coefficients stay in a small range, making it simple and inexpensive to quantize and transmit the coefficients as the compressed CSI. FIG. 8 shows the distribution of the real and imaginary parts of the coefficients found by CSIApx for the strongest antenna pair in each test case, because the distributions for other antenna pairs should just be its scaled versions. It can be seen that all numbers reside in a small range with smooth density.

In an additional exemplary embodiment, CSIApx is further tested with synthesized CSI data, which complements the experimental evaluation by challenging CSIApx with more channel types and testing CSIApx under controllable settings such as the Signal to Noise Ratio (SNR) level.

In the exemplary embodiment, the known channel model code is used to generate CSI for all 64 subcarriers in Wi-Fi on 20 MHz channels for 3 by 3 links with 9 antenna pairs. Four cases, referred to as Model B, Model C, Model D and Model E, are used, which represent typical indoor environments with around 100 ns, 200 ns, 400 ns, and 800 ns delay spread, respectively, which should cover the majority of typical Wi-Fi channels.

As in the experimental data, the maximum amplitude is normalized to 1. White Gaussian noise was added to the CSI vector and a total of 1000 test cases were performed for each SNR level. To simulate imperfect rotation, the CSI is further multiplied by a sinusoid with frequency randomly selected form [−0.0491,0.0491], which translate to within ±25 ns of timing error. The frequency range of sinusoids scanned in CTDP and cCTDP is [−0.0491,1.57], which includes all frequencies in the CSI. As with the experimental data, when evaluating CSIApx, the CSI for all antenna pairs are multiplied by a sinusoid with a positive frequency of 0.0491.

FIG. 9A-FIG. 9D shows a typical fit by CSIApx for each model, where it can be seen that the fitted curve follows very closely to the CSI. As the clean CSI is available, when calculating the final fit residual, the fit is compared with the clean CSI; all prior steps are still based on the noisy CSI. FIG. 10A-FIG. 10D shows the mean of the total fit residual of all antenna pairs in various settings. The fit residual of CSIApx is usually very small, such as about 0.0007 or lower per point at 20 dB or above. In addition, as the noise level reduces by 5 dB, the fit residual in most cases also reduces by roughly 5 dB, suggesting that the fit residual is mostly noise. FIG. 11A-FIG. 11D shows the average compression ratios. It can be seen that CSIApx achieves very high compression ratios in many cases, i.e., above 12.4:1, 7.9:1, 5.5:1, and 4.0:1 against 64 subcarriers for Models B, C, D, E, respectively, when the SNR is 20 dB or above. More complicated channel conditions do pose a challenge to CSIApx as it has to use higher orders to fit the data. Also, although CSIApx may have slightly larger fit residual, it has much higher compression ratios than CTDP in all cases. In addition, the compression ratio CSIApx is more stable than CTDP for each model when the SNR is 20 dB or higher, suggesting the CSIApx is better at capturing the actual signal and less susceptible to the influence of noise. cCTDP has higher fit residual and lower compression ratios in almost all cases when the SNR is 20 dB or higher.

MU-MIMO rate was also tested in a similar manner as with the experimental data. FIG. 12A-FIG. 12D shows the percentage of cases that the normalized rate differences are above 3% or lower than −3%, where it can be seen that the fraction is very low for CSIApx when the SNR is 25 dB or higher, and still reasonably small at 20 dB except for Model E which is the most complicated.

FIG. 13A-FIG. 13D shows the distribution of the fit coefficients by CSIApx for the strongest antenna pair, which is similar to that with the experimental data.

Figure 14:
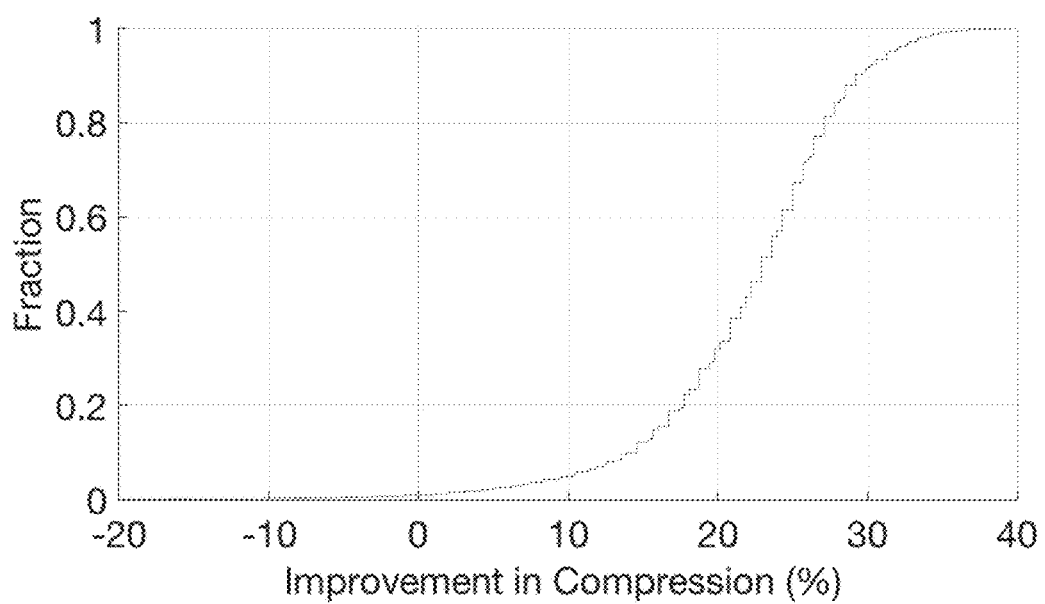
FIG. 14 is a graphical illustration of the potential improvement utilizing Huffman Coding in addition to CSIApx, in accordance with an embodiment of the present invention.
Figures 15A, 15B, 15C, 15D:
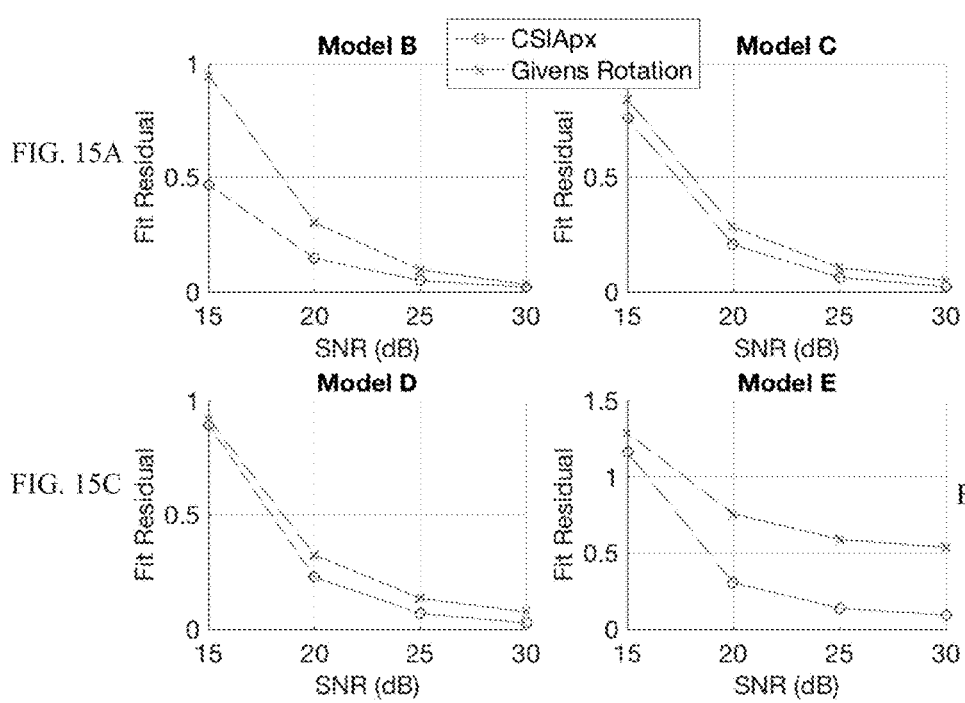
FIG. 15A is a graphical illustration of the comparison between CSIApx and Givens rotation on the model data in a typical indoor environment with around 100 ns delay spread, in accordance with an embodiment of the present invention.
FIG. 15B is a graphical illustration of the comparison between CSIApx and Givens rotation on the model data in a typical indoor environment with around 200 ns delay spread, in accordance with an embodiment of the present invention.
FIG. 15C is a graphical illustration of the comparison between CSIApx and Givens rotation on the model data in a typical indoor environment with around 400 ns delay spread, in accordance with an embodiment of the present invention.
FIG. 15D is a graphical illustration of the comparison between CSIApx and Givens rotation on the model data in a typical indoor environment with around 800 ns delay spread, in accordance with an embodiment of the present invention.

Even higher compression ratio can be achieved for CSIApx by running Huffman coding on the coefficients, taking advantage of the fact that the distribution of the real and imaginary parts of the coefficients, such as that in FIG. 8, is spiky and has low entropy. The process is explained for the experimental data in the following. First, 12 bits for quantization in range [−2.56,2.56] are empirically chosen, which results in negligible quantization error and includes all coefficients. A training set with 3962 experiments is randomly chosen from the data to obtain the dictionary of the Huffman Coding, which is then tested on the remaining data. FIG. 14 shows the CDF of the compression ratio achieved by Huffman Coding, where the ratio is calculated by subtracting the size of the raw coefficients by the size of the compressed coefficients then divided by former. The average compression ratio is 22.1% and the ratio is positive for over 98% of the cases. Separate Huffman Coding dictionaries can also be built for each configuration; however, the results show that the improvement is marginal.

The Wi-Fi standard includes an option to use the Givens Rotation to compress CSI to be sent during the channel sounding procedure. That is, instead of sending the entire CSI, it calculates a compressed feedback matrix by zeroing out some elements, which is later reconstituted to obtain the full CSI. As detailed below, the present invention provides a head-to-head comparison between CSIApx and the Given's rotation method, and argues that CSIApx is a better alternative.

Givens Rotation is lossless in the sense that it does not change the CSI during the compression, and the other end of the communication link can exactly reproduce the measured CSI. It therefore appears that Given's rotation will have higher accuracy than CSIApx, because CSIApx is based on approximation. This is true when the measured CSI is clean, i.e., without any noise. However, measurement noise and quantization noise always exist. In such cases, CSIApx actually achieves better accuracy than the Given's rotation, i.e., the CSI with CSIApx follows the shape of the actual CSI more closely than the Givens Rotation, which is corrupted by noise. To be more fair, before applying Given's Rotation, certain filter can be applied to reduce the noise level. Still, it is found that CSIApx achieves better accuracy, which, from a high level, is because when fitting a CSI curve, CSIApx also serves as a filter, which is better than other general purpose filters.

Figure 16:
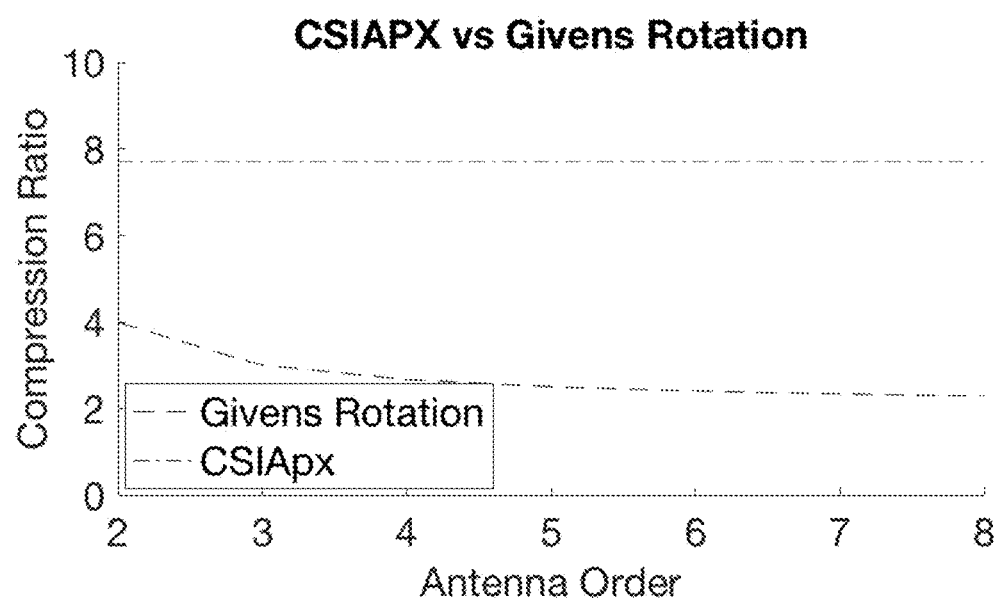
FIG. 16 is a graphical illustration of the compression ratio for the experimental data, in accordance with an embodiment of the present invention.

In the following comparison, the model data is used, because the clean CSI is available for comparison. Before the Givens rotation, a low-pass filter is used in an attempt to filter out some noise, as it is expected that such filter will be used in practice. Due to the low pass filter, only the middle 50 subcarriers are used in this comparison. FIG. 15A-FIG. 15D shows CSIApx and Givens Rotation on the model data, where it can be seen that CSIApx indeed achieves lower fit residual. CSIApx will also enjoy a higher compression ration than the Givens rotation. FIG. 16 shows the compression ratio for the experimental data. As mentioned earlier the average compression ratio achieved by CSIApx for the 2×2 system in a real world setting was 7.68. Because CSIApx fits each antenna pair individually and hence can remain constant even when the number of pairs increases. The compression ratio achieved by Givens rotation on the other hand will keep decreasing as the antenna order increase approaching 2.

Figure 17:
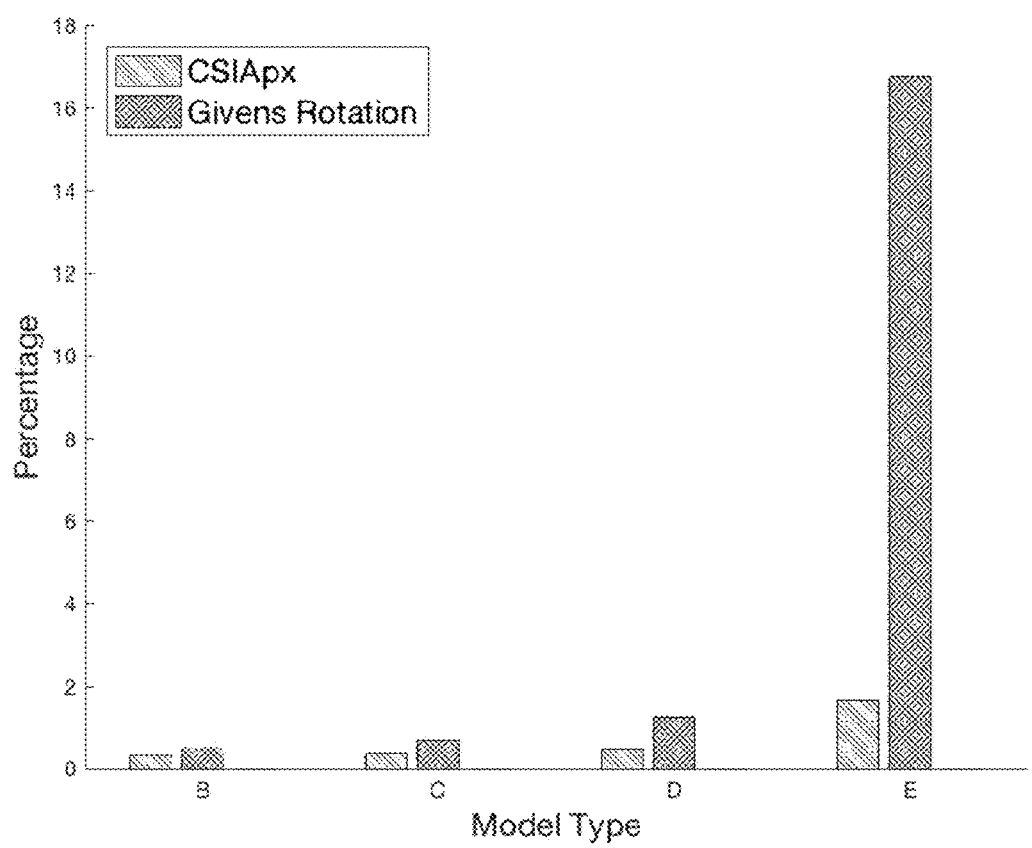
FIG. 17 is a graphical illustrating of a comparison of the data rate achieved in a MU-MIMO setting from both CSIApx and Givens Rotation, showing the percentage of cases where the normalized rate differences, in accordance with an embodiment of the present invention.

The first accuracy is further evaluated by comparing the data rate achieved in a MU-MIMO setting fro both CSIApx and Givens Rotation. FIG. 17 shows the percentage of cases where the normalized rate differences is higher than 3% or lower than −3% when compared against the clean signal. It is seen that CSIApx outperforms Givens Rotation.

Figure 18:
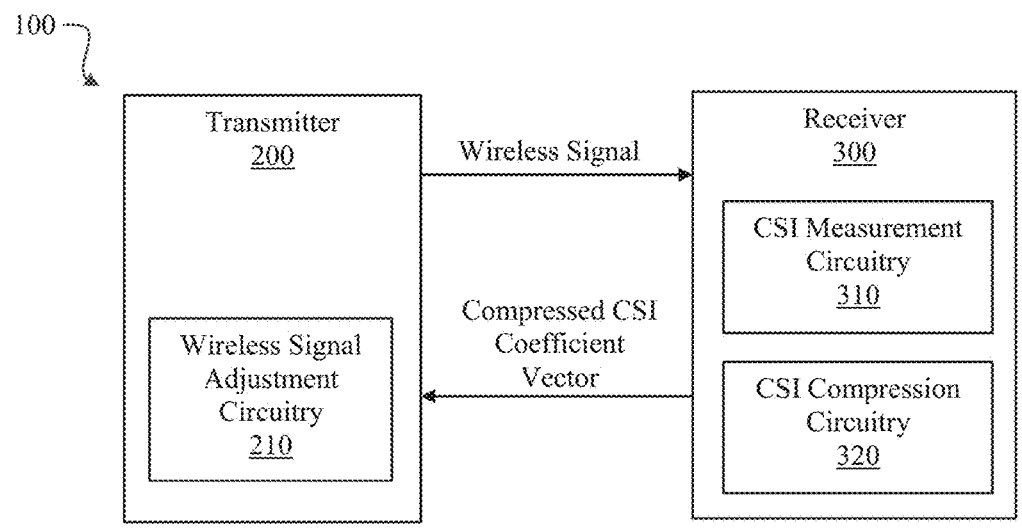
FIG. 18 is a block diagram illustrating a structure of a communication system with channel state information (CSI) feedback, according to an embodiment of the present invention.

FIG. 18 is a block diagram illustrating a structure of a wireless communication system 100 with channel state information (CSI) feedback, according to an embodiment of the present invention. In the illustrated wireless communication system 100, a transmitter 200 transmits a wireless signal to a receiver 300 over a wireless channel, as is commonly known in the art. The receiver 300 receives the wireless signal and the CSI measurement circuitry 310 at the receiver measures the CSI of the wireless channel, as previously described. The CSI compression circuitry 320 then compresses the CSI and transmits the compressed CSI coefficient vector back to the transmitter 200. The transmitter 200 is then able to adjust the transmission of the wireless signal based upon the measured CSI of the wireless channel.

FIG. 19A is a diagram illustrating a first step in the functionality of the CSI compression circuitry 320 of the receiver 300. As shown, the CSI compression circuitry 320 receives the measured N by 1 CSI vector 400 from the CSI measurement circuitry 310, wherein the CSI measurement circuitry 310 measures the channel state information (CSI) vector from the received OFDM wireless signal for each of one or more antenna pair. The CSI compression circuitry 320 then calculates for each of a plurality of configurations their projection vectors, wherein each of the plurality of configurations "u" identifies a set of $P_u$ base sinusoid vectors on constant frequencies and wherein $P_u$ is the order of the configuration and is equal to the number of complex numbers of the compressed CSI if configuration u is selected. As the configurations may share common base sinusoids to reduce computation, the figure shows multiplying the collection of the conjugate of all unique base sinusoids in CSIApx 410 with the CSI 400 to get the collection of dot products for all unique base sinusoids 420.

In a second step illustrated with reference to FIG. 19B, the CSI compression circuitry 320 then finds for each of the plurality of configurations "u" $P_u$ values in the collection of dot products 420 to form a $P_u$ by 1 projection vector, and calculates the product of a constant $P_u$ by $P_u$ matrix 425 stored a the receiver and the $P_u$ by 1 projection vector to generate a $P_u$ by 1 coefficient vector 430.

In the third step, illustrated with reference to FIG. 19C, the CSI compression circuitry 320 then calculates for each of the plurality of configurations a minimum squared error (MSE) fit with the $P_u$ by 1 coefficient vector on L evenly-spaced locations, wherein L is smaller than N, by multiplying each of the $P_u$ base sinusoids with the corresponding coefficient in the coefficient vector 430 and taking the summation, at each of the L evenly-spaced locations 435. The CSI compression circuitry 320 then selects configuration u and uses its $P_u$ by 1 coefficient vector as the compressed CSI, it the total fit residual of the MSE fit of configuration u is below a predetermined threshold times the minimum fit residual among all configurations, and u is such a configuration with the lowest order 440.

Figure 20:
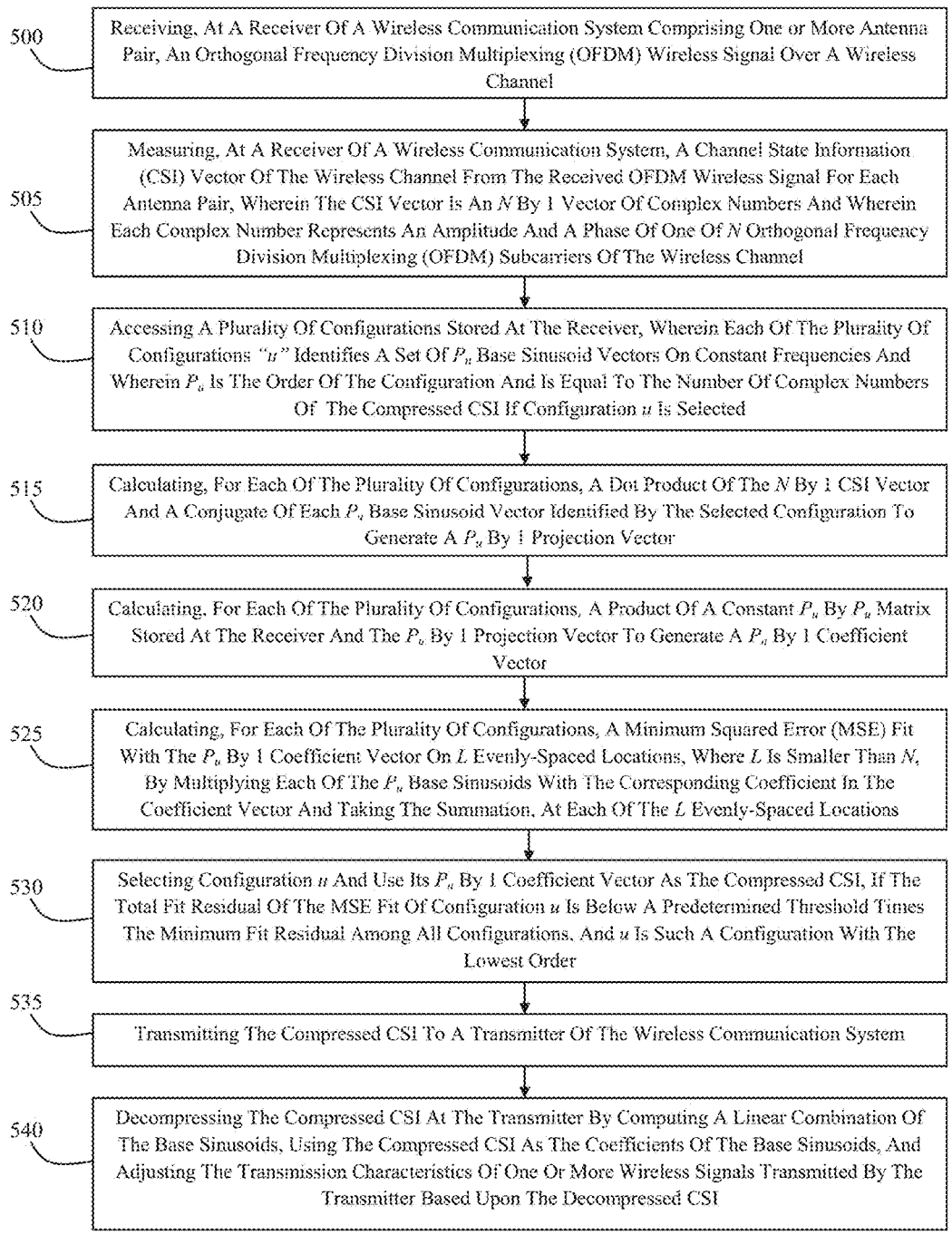
FIG. 20. is a flow diagram illustrating a method for compression the CSI in a wireless communication system, in accordance with an embodiment of the present invention.

FIG. 20 is a flow diagram illustrating a method for compressing channel state information (CSI) of a wireless channel, the method includes, receiving, at a receiver of a wireless communication system, an orthogonal frequency division multiplexing (OFDM) wireless signal over a wireless channel 500 comprising one or more antenna pair, and measuring, at a receiver of a wireless communication system, a channel state information (CSI) vector of the wireless channel from the received OFDM wireless signal for each antenna pair, wherein the CSI vector is an N by 1 vector of complex numbers and wherein each complex number represents an amplitude and a phase of one of N orthogonal frequency division multiplexing (OFDM) subcarriers of the wireless channel 505.

The method further includes, accessing a plurality of configurations stored at the receiver, wherein each of the plurality of configurations "u" identifies a set of $P_u$ base sinusoid vectors on constant frequencies and wherein $P_u$ is the order of the configuration which is equal to the number of complex numbers of the compressed CSI 510 if configuration u is selected, calculating, for each of the plurality of configurations, a dot product of the N by 1 CSI vector and a conjugate of each $P_u$ base sinusoid vector identified by the selected configuration to generate a $P_u$ by 1 projection vector 515, calculating, for each of the plurality of configurations, a product of a constant $P_u$ by $P_u$ matrix stored at the receiver and the $P_u$ by 1 projection vector to generate a $P_u$ by 1 coefficient vector 520 and calculating, for each of the plurality of configurations u, a minimum squared error (MSE) fit with the $P_u$ by 1 coefficient vector on L evenly-spaced locations 525, where L is smaller than N, by multiplying each of the $P_u$ base sinusoids with the corresponding coefficient in the coefficient vector and taking the summation, at each of the L evenly-spaced locations.

After MSE fits for all configurations at the sampling locations have been calculated, the method continues by selecting a configuration u and use its $P_u$ by 1 coefficient vector as the compressed CSI, if the total fit residual of the MSE fit of configuration u is below a predetermined threshold 530 times the minimum fit residual among all configurations, and u is such a configuration with the lowest order, transmitting the compressed CSI to the transmitter of the wireless communication system 535, which may decompress the CSI by computing a linear combination of the base sinusoids, based upon the decompressed CSI 540.

As such, in various embodiments, the present invention describes a system and method for compression of the CSI, referred to as CSIApx, which provides a fast and lightweight method for compressing the CSI of OFDM wireless links. Following the proof that almost any sinusoid can be approximated within a small bounded error as the linear combination of a small number of base sinusoids on constant frequencies and exploiting the constant frequencies of the base sinusoids, it is shown that CSIApx pre-computes key steps and can find a minimum square error fit of the CSI vector with very few computations.

The evaluations of CSIApx with both experimental and synthesized CSI data, show that CSIApx achieves very good compression ratios and approximation accuracy, significantly outperforming the existing solution in nearly all cases at much lower computation cost. As such, CSIApx is considered to be a very useful tool to be incorporated into the Wi-Fi protocol, and will enable timely and accurate CSI feedback to improve the network performance.

The present invention may be implemented in hardware, because of its simplicity and low complexity. It can also be embodied on various computing platforms that perform actions responsive to software-based instructions. The following provides an antecedent basis for the information technology that may be utilized to enable the invention.

The computer readable medium described in the claims below may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. However, as indicated above, due to circuit statutory subject matter restrictions, claims to this invention as a software product are those embodied in a non-transitory software medium such as a computer hard drive, flash-RAM, optical disk or the like.

Program code embodied on a computer readable medium may be transmitted using any appropriate medium, including but not limited to wireless, wire-line, optical fiber cable, radio frequency, etc., or any suitable combination of the foregoing. Computer program code for carrying out operations for aspects of the present invention may be written in any combination of one or more programming languages, including an object oriented programming language such as Java, C#, C++, Visual Basic or the like and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

What is claimed is:

1. A method for compressing channel state information (CSI) of a wireless channel, the method comprising:
    receiving, at a receiver of a wireless communication system, an orthogonal frequency division multiplexing (OFDM) wireless signal over a wireless channel comprising one or more antenna pair;
    measuring, at a receiver of a wireless communication system, a channel state information (CSI) vector of the wireless channel from the received OFDM wireless signal for each antenna pair, wherein the CSI vector is an N by 1 vector of complex numbers and wherein each complex number represents an amplitude and a phase of one of N orthogonal frequency division multiplexing (OFDM) subcarriers of the wireless channel;
    accessing a plurality of configurations stored at the receiver, wherein each of the plurality of configurations "u", identifies a set of $P_u$ base sinusoid vectors on constant frequencies and wherein $P_u$ is the order of the configuration and is equal to the number of complex numbers of the compressed CSI if configuration u is selected;
    calculating, for each of the plurality of configurations, a dot product of the N by 1 CSI vector and a conjugate of each $P_u$ base sinusoid vector identified by the selected configuration to generate a $P_u$ by 1 projection vector;
    calculating, for each of the plurality of configurations, a product of a constant $P_u$ by $P_u$ matrix stored at the receiver and the $P_u$ by 1 projection vector to generate a $P_u$ by 1 coefficient vector;
    calculating, for each of the plurality of configurations, a minimum squared error (MSE) fit with the $P_u$ by 1 coefficient vector on L evenly-spaced locations, where L is smaller than N, by multiplying each of the $P_u$ base sinusoids with the corresponding coefficient in the coefficient vector and taking the summation, at each of the L evenly-spaced locations;
    selecting configuration u and use its $P_u$ by 1 coefficient vector as the compressed CSI, if the total fit residual of the MSE fit of configuration u is below a predetermined threshold times the minimum fit residual among all configurations, and u is such a configuration with the lowest order;
    transmitting the compressed CSI to a transmitter of the wireless communication system;
    decompressing the CSI at the transmitter by computing a linear combination of the base sinusoids, using the compressed CSI as the coefficients of the base sinusoids, and
    adjusting the transmission characteristics of one or more wireless signals transmitted by the transmitter based upon the decompressed CSI.

2. The method of claim 1, further comprising, prior to accessing a plurality of configurations stored at the receiver:
    computing each of a plurality base sinusoid vectors on constant frequencies;
    computing a conjugate of each of the plurality of base sinusoid vectors on constant frequencies;
    storing each base sinusoid vector and the conjugate of each base sinusoid vector at the receiver; and
    storing the plurality of configurations identifying, for configuration u, a set of $P_u$ base sinusoid vectors at the receiver.

3. The method of claim 1, wherein one or of the plurality of base sinusoid vectors are shared by one or more of the plurality of configurations.

4. The method of claim 1, further comprising, prior to calculating, for each of the plurality of configurations,
    computing the inverse of a constant $P_u$ by $P_u$ matrix and storing it at the receiver.

5. The method of claim 1, wherein accessing a plurality of configurations stored at the receiver further comprises accessing a plurality of configurations stored at the receiver in parallel.

6. The method of claim 1, further comprising, rotating the CSI vector to remove the shift frequency from the CSI vector.

7. A wireless communication system for compressing channel state information (CSI) of a wireless channel system, the system comprising:
    a receiver for receiving an orthogonal frequency division multiplexing (OFDM) wireless signal over a wireless channel comprising one or more antenna pair;
    the receiver for measuring a channel state information (CSI) vector of the wireless channel from the received OFDM wireless signal, wherein the CSI vector for each antenna pair is an N by 1 vector of complex numbers and wherein each complex number represents an amplitude and a phase of one of N orthogonal frequency division multiplexing (OFDM) subcarriers of the wireless channel;
    the receiver for accessing a plurality of configurations "u" stored at the receiver, identifies a set of $P_u$ base sinusoid vectors on constant frequencies and wherein $P_u$ is the order of the configuration and is equal to the number of complex numbers of the compressed CSI if configuration u is selected;
    the receiver for calculating, for each of the plurality of configurations, a dot product of the N by 1 CSI vector and a conjugate of each $P_u$ base sinusoid vector identified by the selected configuration to generate a $P_u$ by 1 projection vector;

the receiver for calculating, for each of the plurality of configurations, a product of a constant $P_u$ by $P_u$ matrix stored at the receiver and the $P_u$ by 1 projection vector to generate a $P_u$ by 1 coefficient vector;

the receiver for calculating, for each of the plurality of configurations, a minimum squared error (MSE) fit with the $P_u$ by 1 coefficient vector on L evenly-spaced locations, where L is smaller than N, by multiplying each of the $P_u$ base sinusoids with the corresponding coefficient in the coefficient vector and taking the summation, at each of the L evenly-spaced locations;

the receiver for selecting configuration it and use its $P_u$ by 1 coefficient vector as the compressed CSI, if the total fit residual of the MSE fit of configuration u is below a predetermined threshold times the minimum fit residual among all configurations, and u is such a configuration with the lowest order;

the receiver for transmitting the compressed CSI to a transmitter of the wireless communication system; and the transmitter for decompressing the CSI by computing a linear combination of the base sinusoids, using the compressed CSI as the coefficients of the base sinusoids, and adjusting the transmission characteristics of one or more wireless signals transmitted by the transmitter based upon the decompressed CSI.

8. The system of claim 7, further comprising, prior to the receiver accessing a plurality of configurations stored at the receiver, the receiver computing each of a plurality base sinusoid vectors on constant frequencies, computing a conjugate of each of the plurality of base sinusoid vectors on constant frequencies, storing each base sinusoid vector and the conjugate of each base sinusoid vector at the receiver and storing the plurality of configurations identifying a set of base sinusoid vectors of the plurality of base sinusoid vectors at the receiver.

9. The system of claim 7, wherein one or more of the plurality of base sinusoid vectors are shared by one or more of the plurality of configurations.

10. The system of claim 7, further comprising, prior to calculating, for each of the plurality of configurations, computing the inverse of a constant $P_u$ by $P_u$ matrix and storing it at the receiver.

11. The system of claim 7, wherein the receiver accessing a plurality of configurations stored at the receiver further comprises the receiver accessing a plurality of configurations stored at the receiver in parallel.

12. The system of claim 7, further comprising, the receiver rotating the CSI vector to remove the shift frequency from the CSI vector.

13. A non-transitory computer-readable storage recording medium storing a computer program used for executing a channel state information (CSI) compressing operation of an Orthogonal Frequency Division Multiplexing (OFDM) wireless channel of a wireless communication system, the computer program causing a wireless communication system to:

receive, at a receiver of the wireless communication system, an orthogonal frequency division multiplexing (OFDM) wireless signal over a wireless channel comprising one or more antenna pair;

measure, at a receiver of the wireless communication system, a channel state information (CSI) vector of the wireless channel from the received OFDM wireless signal, wherein the CSI vector for each antenna pair is an N by 1 vector of complex numbers and wherein each complex number represents an amplitude and a phase of one of N orthogonal frequency division multiplexing (OFDM) subcarriers of the wireless channel;

access a plurality of configurations stored at the receiver, wherein each of the plurality of configurations "u" identifies a set of $P_u$ base sinusoid vectors on constant frequencies and wherein $P_u$ is the order of the configuration and is equal to the number of complex numbers of the compressed CSI if configuration u is selected;

calculate, for each of the plurality of configurations, a dot product of the N by 1 CSI vector and a conjugate of each $P_u$ base sinusoid vector identified by the selected configuration to generate a $P_u$ by 1 projection vector;

calculate, for each of the plurality of configurations, a product of a constant $P_u$ by $P_u$ matrix stored at the receiver and the $P_u$ by 1 projection vector to generate a $P_u$ by 1 coefficient vector;

calculate, for each of the plurality of configurations, a minimum squared error (MSE) fit with the $P_u$ by 1 coefficient vector on L evenly-spaced locations, where L is smaller than N, by multiplying each of the $P_u$ base sinusoids with the corresponding coefficient in the coefficient vector and take the summation, at each of the L evenly-spaced locations;

select configuration u and use its $P_u$ by 1 coefficient vector as the compressed CSI, if the total fit residual of the MSE fit of configuration u is below a predetermined threshold times the minimum fit residual among all configurations, and u is such a configuration with the lowest order transmit the compressed CSI to a transmitter of the wireless communication system;

decompress the CSI by computing a linear combination of the base sinusoids, using the compressed CSI as the coefficients of the base sinusoids, and adjusting the transmission characteristics of one or more wireless signals transmitted by the transmitter based upon the decompressed CSI.

14. The non-transitory computer-readable storage recording medium of claim 13, further comprising, prior to accessing a plurality of configurations stored at the receiver, the computer program causing the wireless communication system to:

compute each of a plurality base sinusoid vectors on constant frequencies;

compute a conjugate of each of the plurality of base sinusoid vectors on constant frequencies, store each base sinusoid vector and the conjugate of each base sinusoid vector at the receiver; and store the plurality of configurations identifying a set of base sinusoid vectors of the plurality of base sinusoid vectors at the receiver.

15. The non-transitory computer-readable storage recording medium of claim 13, wherein one or more of the plurality of base sinusoid vectors are shared by one or more of the plurality of configurations.

16. The non-transitory computer-readable storage recording medium of claim 13, further comprising, prior the computer program causing the wireless communication system to calculate, for each of the plurality of configurations, the inverse of a constant $P_u$ by $P_u$ matrix and store it at the receiver.

17. The non-transitory computer-readable storage recording medium of claim 13, wherein the computer program causing the wireless communication system to access a plurality of configurations stored at the receiver further comprises the computer program causing the wireless communication system to access a plurality of configurations stored at the receiver in parallel.

18. The non-transitory computer-readable storage recording medium of claim 13, further comprising, the computer program causing the wireless communication system to preprocess the CSI vector to rotate the CSI vector to remove the shift frequency from the CSI vector.

* * * * *

UNITED STATES PATENT AND TRADEMARK OFFICE
CERTIFICATE OF CORRECTION

PATENT NO. : 9,838,104 B1
APPLICATION NO. : 15/434704
DATED : December 5, 2017
INVENTOR(S) : Zhenghao Zhang and Avishek Mukherjee It is certified that error appears in the above-identified patent and that said Letters Patent is hereby corrected as shown below:

In the Claims

Column 25, Claim 7, Line 15 should read:
the receiver for selecting configuration $u$ and use its Pu by Column 25, Claim 13, Line 53 should read:
11. A non-transitory computer-readable storage Column 26, Claim 14, Lines 40-41 should read:
12. The non-transitory computer-readable storage medium of claim 13, further comprising, prior to access- Column 26, Claim 15, Lines 54-55 should read:
13. The non-transitory computer-readable storage medium of claim 13, wherein one or more of the Column 26, Claim 16, Lines 58-59 should read:
14. The non-transitory computer-readable storage medium of claim 13, further comprising, prior the Column 26, Claim 17, Lines 64-65 should read:
15. The non-transitory computer-readable storage medium of claim 13, wherein the computer program Column 27, Claim 18, Lines 4-5 should read:
16. The non-transitory computer-readable storage medium of claim 13, further comprising, the computer Signed and Sealed this
Seventh Day of August, 2018

Andrei Iancu
*Director of the United States Patent and Trademark Office*